United States Patent
Wang et al.

(10) Patent No.: US 11,189,525 B2
(45) Date of Patent: Nov. 30, 2021

(54) VIA-FIRST PROCESS FOR CONNECTING A CONTACT AND A GATE ELECTRODE

(71) Applicant: Taiwan Semiconductor Manufacturing Co., Ltd., Hsin-Chu (TW)

(72) Inventors: Chao-Hsun Wang, Chung-Li (TW); Mei-Yun Wang, Chu-Pei (TW); Kuo-Yi Chao, Hsinchu (TW); Wang-Jung Hsueh, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/797,375

(22) Filed: Feb. 21, 2020

(65) Prior Publication Data

US 2021/0265202 A1 Aug. 26, 2021

(51) Int. Cl.
  *H01L 21/768* (2006.01)
  *H01L 27/11* (2006.01)
  (Continued)

(52) U.S. Cl.
  CPC .. *H01L 21/76816* (2013.01); *H01L 21/02063* (2013.01); *H01L 21/31116* (2013.01);
  (Continued)

(58) Field of Classification Search
  CPC ......... H01L 21/76816; H01L 23/53266; H01L 21/76834; H01L 27/1104; H01L 21/02063;
  (Continued)

(56) References Cited

U.S. PATENT DOCUMENTS

| | | | |
|---|---|---|---|
| 7,169,676 B1* | 1/2007 | Zhong | H01L 21/26586 257/E21.165 |
| 2013/0069161 A1 | 3/2013 | Yang et al. | |

(Continued)

OTHER PUBLICATIONS

Tech Design Forum. "10nm Processes" The date of publication is unknown. Retrieved online on Oct. 22, 2019 from https://www.techdesignforums.com/practice/guides/10nm-processes/.

(Continued)

*Primary Examiner* — Shahed Ahmed
*Assistant Examiner* — Vicki B. Booker
(74) *Attorney, Agent, or Firm* — Eschweiler & Potashnik, LLC

(57) ABSTRACT

Various embodiments of the present disclosure provide a via-first process for connecting a contact to a gate electrode. In some embodiments, the contact is formed extending through a first interlayer dielectric (ILD) layer to a source/drain region bordering the gate electrode. An etch stop layer (ESL) is deposited covering the first ILD layer and the contact, and a second ILD layer is deposited covering the ESL. A first etch is performed into the first and second ILD layers and the etch stop layer to form a first opening exposing the gate electrode. A series of etches is performed into the second ILD layer and the etch stop layer to form a second opening overlying the contact and overlapping the first opening, such that a bottom of the second opening slants downward from the contact to the first opening. A gate-to-contact (GC) structure is formed filling the first and second openings.

20 Claims, 17 Drawing Sheets

(51) Int. Cl.
*H01L 23/522* (2006.01)
*H01L 21/311* (2006.01)
*H01L 23/528* (2006.01)
*H01L 21/02* (2006.01)
*H01L 23/532* (2006.01)

(52) U.S. Cl.
CPC .... *H01L 21/76834* (2013.01); *H01L 23/5226* (2013.01); *H01L 23/5283* (2013.01); *H01L 23/53266* (2013.01); *H01L 27/1104* (2013.01)

(58) Field of Classification Search
CPC ........... H01L 23/5283; H01L 21/31116; H01L 23/5226
See application file for complete search history.

(56) References Cited

U.S. PATENT DOCUMENTS

| | | |
|---|---|---|
| 2018/0286957 A1 | 10/2018 | Bae et al. |
| 2019/0067436 A1 | 2/2019 | Wu et al. |
| 2019/0164813 A1 | 5/2019 | Wang et al. |

OTHER PUBLICATIONS

Lapedus, Mark. "New BEOL/MOL Breakthroughs?" Semiconductor Engineering, published on Jun. 15, 2017.

* cited by examiner

VIA-FIRST PROCESS FOR CONNECTING A CONTACT AND A GATE ELECTRODE

BACKGROUND

The integrated circuit (IC) manufacturing industry has experienced exponential growth over the last few decades. As ICs have evolved, functional density (e.g., the number of interconnected devices per chip area) has increased while feature sizes have decreased. One of the technologies being employed to continue the increase in functional density is middle-of-the-line (MOL) processing. MOL processing is performed between front-end-of-line (FEOL) processing and back-end-of-line (BEOL) processing and forms MOL interconnect structures that provide local routing between devices. The MOL interconnect structures may be formed with high density and alleviate consumption of scarce routing resources during BEOL processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
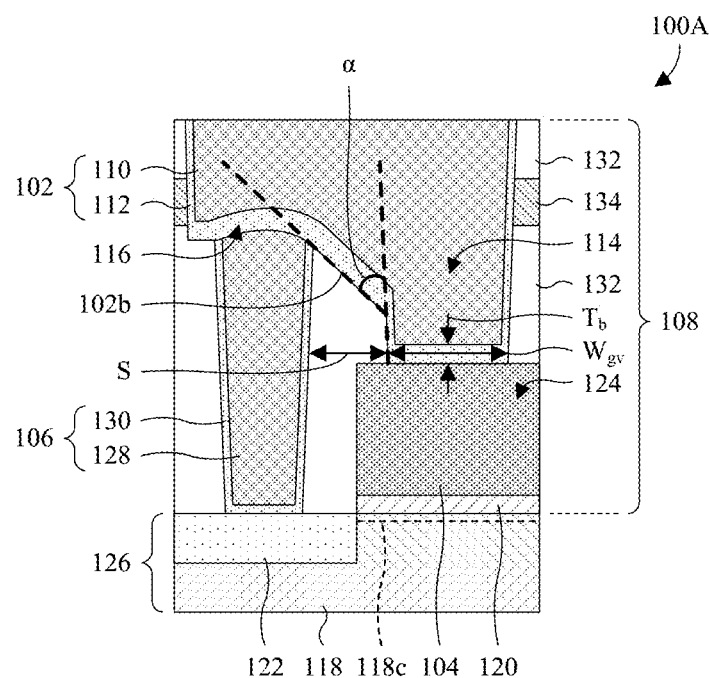
FIGS. 1A-1D illustrate cross-sectional views of various embodiments of an integrated circuit (IC) comprising a gate-to-contact (GC) structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated circuit (IC) comprises a middle-of-the-line (MOL) region in which an active region (AR) contact and a gate contact are arranged. The AR contact extends from the gate contact to a source/drain region of a semiconductor device. The gate contact overlies and directly contacts the AR contact and a gate electrode of the semiconductor device. In some embodiments, a process for forming the AR contact and the gate contact comprises: 1) depositing an interlayer dielectric (ILD) layer covering the semiconductor device; 2) performing a first etch into the ILD layer to form an AR opening exposing the source/drain region; 3) performing a second etch into the ILD layer to form a gate opening overlapping with the AR opening and exposing the gate electrode; 4) depositing a metal layer filling the AR opening and the gate opening; and 5) performing a planarization into the metal layer and the ILD layer until top surfaces thereof are about even. A portion of the metal layer in the AR opening defines the AR contact, and a portion of the metal layer in the gate opening defines the gate contact.

A challenge with the process is that the source/drain region may be exposed in the AR opening during the second etch. This may lead to oxide forming on the source/drain region during the second etch. The oxide may, in turn, increase a contact resistance between the AR contact and the source/drain region and may hence shift operating parameters of the IC out of specification and/or lead to failure.

An additional challenge with the process is that the second etch process is subject to a large number of constraints regarding the gate opening. The gate opening has to overlap with the AR opening and the gate electrode while remaining sufficiently spaced from other gate electrodes and other AR contacts. Therefore, the process depends upon a high degree of overlay control and a high degree of dimension control. Failure to attain the high degrees of overlay and dimension control may lead to high leakage current and/or electrical shorting from the gate contact to another gate electrode and/or another AR contact. Further, failure to attain the high degrees of overlay and dimension control may lead to the gate opening failing to overlap with the AR opening, whereby the gate contact and the AR contact may fail to electrically couple to each other. Further yet, failure to attain the high degrees of overlay and dimension control may lead to the gate opening failing to expose the gate electrode, whereby the gate contact and the gate electrode may fail to electrically couple to each other.

Various embodiments of the present application are directed to a via-first process for electrically coupling an AR contact and a gate electrode, as well as a gate-to-contact (GC) structure resulting from the via-first process. According to some embodiments of the via-first process, the AR contact and the gate electrode are provided. The gate electrode is part of a semiconductor device and overlies an AR of the semiconductor device. The AR contact extends through a first ILD layer overlying the semiconductor device to a source/drain region of the semiconductor device or to some other location in the AR. An etch stop layer (ESL) is deposited covering the first ILD layer, and a second ILD layer is deposited covering the ESL. A first etch is performed into the first and second ILD layers and the ESL to form a first opening exposing the gate electrode. A second etch is performed into the second ILD layer, and stops on the ESL, to form a second opening overlying the AR contact and overlapping with the first opening. A third etch is performed into the ESL through the second opening to extend the second opening to the AR contact and to slant a bottom of the second opening downward from the AR contact to the first opening. A metal layer is deposited filling the first and second openings, and a planarization is performed into a top surface of the metal layer and a top surface of the second ILD layer until the top surfaces are about even. A portion of the metal layer in the first opening defines a gate via. A portion of the metal layer in the second opening defines a gate contact overlying the gate via. Collectively, the gate via and the gate contact define the GC structure.

Because the AR contact is formed before the via-first process, the AR is not exposed while forming the GC structure and is hence not subject to oxidation while forming the GC structure. Because the bottom of the second opening slants downward from the AR contact to the first opening, an aspect ratio (e.g., a ratio of height to width) of the first opening is low and the metal layer is deposited with less risk of seams and voids forming in the first opening. Such seams and voids would increase the resistance from the gate contact to the gate electrode and could hence shift operating parameters out of specification and/or increase power consumption.

Because the via-first process forms the gate contact on the gate via, overlay control and dimension control may be more relaxed compared to an alternative process that forms the gate contact directly on the gate electrode. Hence, a process window (e.g., a robustness) of the via-first process may be larger compared to this alternative process. Landing the gate via on the gate electrode is more robust than landing the gate contact directly on the gate electrode because the gate via may be centered over the gate electrode and may be smaller than the gate contact. Landing the gate contact on the gate via is more robust than landing the gate contact on the gate electrode because the gate via vertically spaces the gate contact from other gate electrodes. As such, there is less of a risk of leakage current and/or electrically coupling with the other gate electrodes. Further, the first opening provides a buffer to laterally space the second opening from another AR contact on an opposite side of the first opening as the AR contact. As such, there is less of a risk of leakage current and/or electrically coupling with the other AR contact.

With reference to FIG. 1A, a cross-sectional view 100A of some embodiments of an IC comprising a GC structure 102 is provided. The GC structure 102 electrically couples a gate electrode 104 to an AR contact 106 that neighbors the gate electrode 104. The AR contact 106 may, for example, also be known as a metal-to-oxide diffusion (MD) contact or a first level contact. The GC structure 102 and the AR contact 106 are in a MOL region 108 of the IC. The MOL region 108 provides local electrical routing to alleviate consumption of electrical routing resources in a back-end-of-line (BEOL) region (not shown) of the IC that overlies the MOL region 108.

The GC structure 102 comprises a GC plug 110 and a GC barrier 112 cupping an underside of the GC plug 110. The GC barrier 112 blocks material from the GC plug 110 from diffusing out of the GC plug 110 to surrounding structure and/or blocks material from surrounding structure from diffusing to the GC plug 110. In some embodiments, the GC barrier 112 also serves as an adhesion layer for the GC plug 110. The GC barrier 112 may be or comprise, for example, titanium, titanium nitride, tantalum nitride, tantalum, some other suitable barrier material(s), or any combination of the foregoing. The GC plug 110 may be or comprise, for example, cobalt, ruthenium, tungsten, some other suitable metal(s), or any combination of the foregoing.

In some embodiments, a thickness $T_b$ of the GC barrier 112 is greater at a bottom of the GC barrier 112 than at sidewalls of the GC barrier 112. For example, the thickness $T_b$ may be about 3-8 nanometers at the bottom and/or about 1-3 nanometers at the sidewalls. Other thickness values are, however, amenable at the bottom of the GC barrier 112 and/or at the sidewalls of the GC barrier 112. If the thickness $T_b$ is too small (e.g., less than about 1 nanometer or some other suitable value), the GC barrier 112 may be unable to effectively block material diffusion and/or the GC plug 110 may fail to adhere to the GC barrier 112. If the thickness $T_b$ is too large (e.g., larger than about 8 nanometers or some other suitable value), a resistance from the GC plug 110 to the gate electrode 104 may be high because the GC barrier 112 may have a higher resistance than the GC plug 110. The high resistance may, in turn, shift operating parameters of the IC out of specification and/or lead to high power consumption.

The GC structure 102 defines a gate via 114 and a gate contact 116. The gate contact 116 overlies the gate via 114 and the AR contact 106 and further extends laterally from the gate via 114 to the AR contact 106. The gate contact 116 may, for example, also be known as a metal-to-polysilicon (MP) contact or a second level contact. However, note that the gate electrode 104 is not limited to polysilicon and may be or comprise metal and/or other suitable material(s). The gate via 114 extends downward from the gate contact 116 to the gate electrode 104.

A bottom surface 102b of the GC structure 102 slants downward from the AR contact 106 to the gate via 114 at an angle α relative to a sidewall of the GC structure 102 that is at the gate via 114. By forming the GC structure 102 with the slanting, an opening within which the gate via 114 is formed has a low aspect ratio (e.g., a low ratio of height to width). If not for the slanting, the bottom surface 102b of the GC structure 102 may be substantially horizontal and the opening may have a high aspect ratio. The high aspect ratio may lead to clustering of material around a top corner in the opening while depositing layers from which the GC structure 102 is formed. The clustering may pinch off a top of the opening before the opening is fully filled to form seams or voids. Therefore, by forming the GC structure 102 with the slanting, the likelihood of seams and voids at the gate via 114 is reduced. Such seams and voids may increase the resistance from the gate contact 116 to the gate electrode 104 and may hence shift operating parameters of the IC out of specification and/or lead to high power consumption.

In some embodiments, the angle α is about 30-70 degrees, about 30-50 degrees, about 50-70 degrees, or some other suitable value. If the angle α is too small (e.g., less than about 30 degrees or some other suitable value), the aspect ratio of the gate via 114 may be high. As such, the likelihood of seems and voids at the gate via 114 may be high. If the angle α is too large (e.g., greater than about 70 degrees or some other suitable value), the gate contact 116 may get too close to substrate 126. This, in turn, may increase the likelihood of leakage current and/or electrical shorting from the gate contact 116 to neighboring structure (e.g., a neighboring gate electrode).

In embodiments, the angle α and the aspect ratio of the gate via 114 depend upon a space S between the gate via 114 and the AR contact 106. For example, the angle α and the aspect ratio may increase as the space S decreases. In some embodiments, the space S is about 9-18 nanometers, about 9.0-13.5 nanometers, about 13.5-18.0 nanometers, or some other suitable value. If the space S is too small (e.g., less than about 9 nanometers or some other suitable value), the angle α may be large and the aspect ratio of the gate via 114 may be high. As such, the likelihood of seems and voids at the gate via 114 may be high. At emerging and future process nodes, the space S may, for example, be limited by feature density, such that the space S may, for example, be less than about 18 nanometers or some other suitable value. In some embodiments, the space S is about 9-18 nanometers and the angle α is about 45-60 degrees. Other values for the space S and the angle α are, however, amenable.

In some embodiments, the gate via 114 has a width $W_{gv}$ of about 8-25 nanometers, about 8.0-16.5 nanometers, about 16.5-25.0 nanometers, or some other suitable value. If the width $W_{gv}$ is too small (e.g., less than about 8 nanometers or some other suitable value), the gate via 114 may have a high aspect ratio and may hence be prone to seams and voids. Additionally, formation of the gate via 114 may be challenging due to the small size. If the width $W_{gv}$ is too large (e.g., greater than about 25 nanometers or some other suitable value), there is a high risk that the gate via 114 may get too close to a neighboring AR contact (not shown). This, in turn, may lead to leakage current and/or electrically coupling with the neighboring AR contact.

The gate electrode 104 is spaced over a substrate 118 by a gate dielectric layer 120 and borders a source/drain region 122. The substrate 118 may be, for example, a bulk silicon substrate, a silicon-on-insulator (SOI) substrate, or some other suitable semiconductor substrate. The gate dielectric layer 120 may be or comprise, for example, silicon oxide, a high k dielectric, some other suitable dielectric material(s), or any combination of the foregoing. The gate electrode 104 may be or comprise, for example, doped polysilicon, metal, some other suitable conductive material(s), or any combination of the foregoing.

The source/drain region 122 is at an opposite end of a channel region 118c as another source/drain region (not shown). The channel region 118c underlies the gate electrode 104 in the substrate 118 and is configured change between a conductive state and a non-conductive state depending upon a bias voltage applied to the gate electrode 104. The source/drain region 122 may be or comprise, for example, a doped semiconductor region of the substrate 118 and/or an epitaxial layer grown on the substrate 118. In some embodiments, the substrate 118 is monocrystalline silicon and the source/drain region 122 is silicon germanium or silicon carbide. Other materials are, however, amenable. The source/drain region 122, the channel region 118c, the gate electrode 104, and the gate dielectric layer 120 partially define a semiconductor device 124. The semiconductor device 124 may, for example, be a field-effect transistor (FET), some other suitable transistor, a memory cell, or some other suitable semiconductor device.

The AR contact 106 extends from the GC structure 102 to the source/drain region 122, and the AR contact 106 and the GC structure 102 collectively define a composite conductive structure electrically coupling the gate electrode 104 to the source/drain region 122. In alternative embodiments, the AR contact 106 extends to a body contact region (not shown) of the semiconductor device 124 or to some other location in an active region 126 of the semiconductor device 124. The active region 126 is a semiconductor region upon which the semiconductor device 124 is formed and is at least partially defined by the source/drain region 122 and a top portion of the substrate 118 underlying the gate electrode 104. In some embodiments, the active region 126 further comprises the body contact region. In some embodiments, the active region 126 is demarcated by a shallow trench isolation (STI) structure (not shown) and/or some other suitable trench isolation structure. The active region 126 may, for example, also be known as an oxide diffusion (OD) region and/or a device region. The AR contact 106 comprises an AR plug 128 and an AR barrier 130 cupping an underside of the AR plug 128.

The AR barrier 130 blocks material from the AR plug 128 from diffusing out of the AR plug 128 to surrounding structure and/or blocks material from surrounding structure from diffusing to the AR plug 128. In some embodiments, the AR barrier 130 also serves as an adhesion layer for the AR plug 128. The AR barrier 130 may be or comprise, for example, titanium, titanium nitride, tantalum nitride, some other suitable barrier material(s), or any combination of the foregoing. The AR plug 128 may be or comprise, for example, cobalt, ruthenium, tungsten, some other suitable metal(s), or any combination of the foregoing. In some embodiments, the AR plug 128 and the GC plug 110 are or comprise the same material and/or define a composite plug. In some embodiments, the AR barrier 130 and the GC barrier 112 are or comprise the same material and/or define a composite barrier layer extending in a closed path around the AR plug 128.

A pair of interlayer dielectric (ILD) layers 132 and an etch stop layer 134 are stacked over the substrate 118 and accommodate the AR contact 106 and the GC structure 102. The etch stop layer 134 separates the ILD layers 132 from each other and is about level with a bottom of the gate contact 116. The ILD layers 132 may be or comprise, for example, silicon oxide, silicon nitride, a low k dielectric, some other suitable dielectric(s), or any combination of the foregoing. The etch stop layer 134 may be or comprise, for example, silicon nitride, silicon carbide, some other suitable dielectric(s), or any combination of the foregoing.

As seen hereafter, the etch stop layer 134 provides control over the vertical separation from the gate contact 116 to the gate electrode 104 and also to neighboring gate electrodes (not shown). Further, as seen hereafter, the GC structure 102 is formed after the AR contact 106. As such, the opening within which the AR contact 106 is formed is filled during formation of the GC structure 102 and the source/drain region 122 is not exposed through the opening during formation of the GC structure 102. This, in turn, reduces the likelihood of oxide forming on the source/drain region 122 and increasing the resistance from the AR contact 106 to the source/drain region 122. Such increased resistance could shift operating parameters of the IC out of specification, reduce yields, increase power consumption, and so on.

Further yet, as seen hereafter, forming the gate contact 116 spaced over and electrically coupled to the gate electrode 104 by the gate via 114 has a larger process window (e.g., is more robust) than omitting the gate via 114 and forming the gate contact 116 directly on the gate electrode 104. Forming the gate contact 116 directly on the gate electrode 104 comprises landing the gate contact 116 on both the gate electrode 104 and the AR contact 106 while remaining sufficiently spaced from neighboring structure to avoid leakage current and/or electrical coupling. Such neighboring structure may include, for example, neighboring gate electrodes (not shown) and neighboring AR contacts (not shown). As such, landing the gate contact 116 directly on the gate electrode 104 is subject to a large number of overlay and/or dimension constraints. Further, because of the large size of the gate contact 116, the constraints are fairly stringent to avoid leakage current and/or electrical coupling to the neighboring structure.

In contrast, forming the gate contact 116 spaced over and electrically coupled to the gate electrode 104 by the gate via 114 comprises landing a gate via 114 on the gate electrode 104 and landing the gate contact 116 on the gate via 114. Landing the gate via 114 on the gate electrode 104 is subject to fewer constraints than landing the gate contact 116 on the gate electrode 104. The gate via 114 does not land on the AR contact 106, so the gate via 114 may be centered over the gate electrode 104. Further, the gate via 114 is smaller than the gate contact 116, so there is less risk of the gate via 114 getting too close to neighboring structure and causing leakage current and/or electrical coupling. As such, overlay and/or dimension constraints may be less stringent.

Landing the gate contact 116 on the gate via 114 is also subject to less stringent overlay and/or dimension constraints than landing the gate contact 116 on the gate electrode 104. The gate contact 116 is vertically offset from the gate electrode 104 and neighboring gate electrodes (not shown), so there is less risk of leakage current and/or electrical coupling from the gate contact 116 to the neighboring gate electrodes (not shown). Further, a via opening within which the gate via 114 is formed provides a buffer laterally between a neighboring AR contact (not shown) and a contact opening within which the gate contact 116 is formed. The buffer reduces the likelihood of the contact opening, and hence the gate contact 116, getting too close to the neighboring AR contact. This, in turn, reduces the likelihood of leakage current and/or electrical coupling from the gate contact 116 to the neighboring AR contact.

Figure 1B:
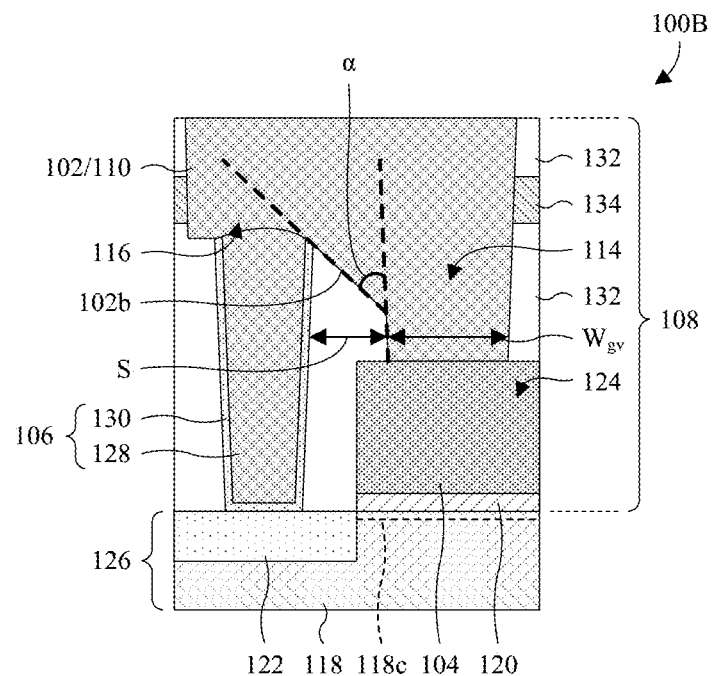

With reference to FIG. 1B, a cross-sectional view 100B of some alternative embodiments of the IC of FIG. 1A is provided in which the GC barrier 112 is omitted. As such, the GC structure 102 and the GC plug 110 are one and the same. Because the GC barrier 112 may, for example, have a higher resistance than the GC plug 110, omitting the GC barrier 112 may reduce a resistance from the gate contact 116 to the gate electrode 104. This may reduce power consumption and/or improve performance of the semiconductor device 124. The GC structure 102 and the GC plug 110 may, for example, be or comprise tungsten, ruthenium, cobalt, some other suitable conductive material(s), or any combination of the foregoing. In some embodiments, the GC structure 102 is or consists essentially of a single material throughout an entirety of the GC structure 102. In some embodiments, GC plug 110 and the AR plug 128 are the same material. In alternative embodiments, the GC plug 110 and the AR plug 128 are different materials.

Figure 1C:
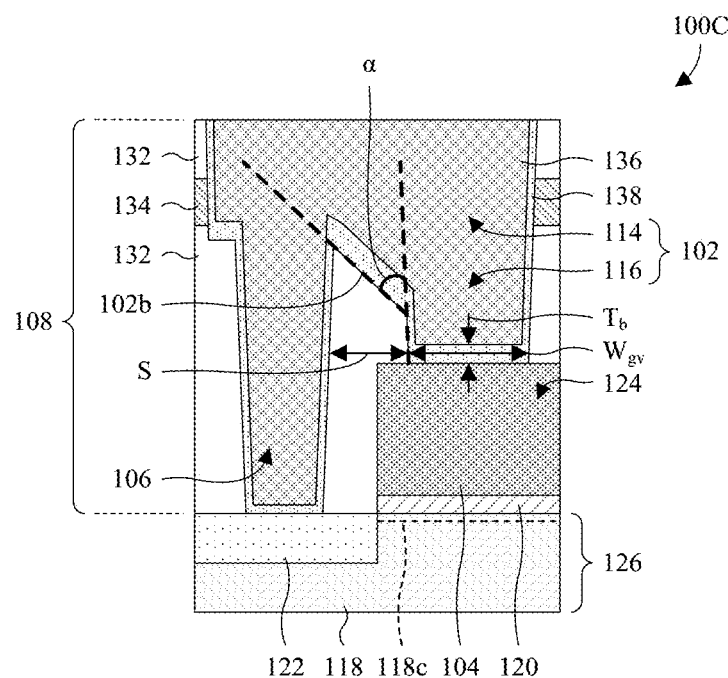

With reference to FIG. 1C, a cross-sectional view 100C of some alternative embodiments of the IC of FIG. 1A is provided in which the gate via 114 and the gate contact 116 (collectively, the GC structure 102) share a plug 136 and a barrier 138 with the AR contact 106. The plug 136 may, for example, be as the GC plug 110 of FIG. 1A and/or the AR plug 128 of FIG. 1A is/are described. Further, the plug 136 may be or comprise, for example, cobalt, ruthenium, tungsten, some other suitable metal(s), or any combination of the foregoing. The barrier 138 may, for example, be as the GC barrier 112 of FIG. 1A and/or the AR barrier 130 of FIG. 1A is/are described. Further, the barrier 138 may be or comprise, for example, titanium, titanium nitride, tantalum nitride, tantalum, some other suitable barrier material(s), or any combination of the foregoing.

Figure 1D:
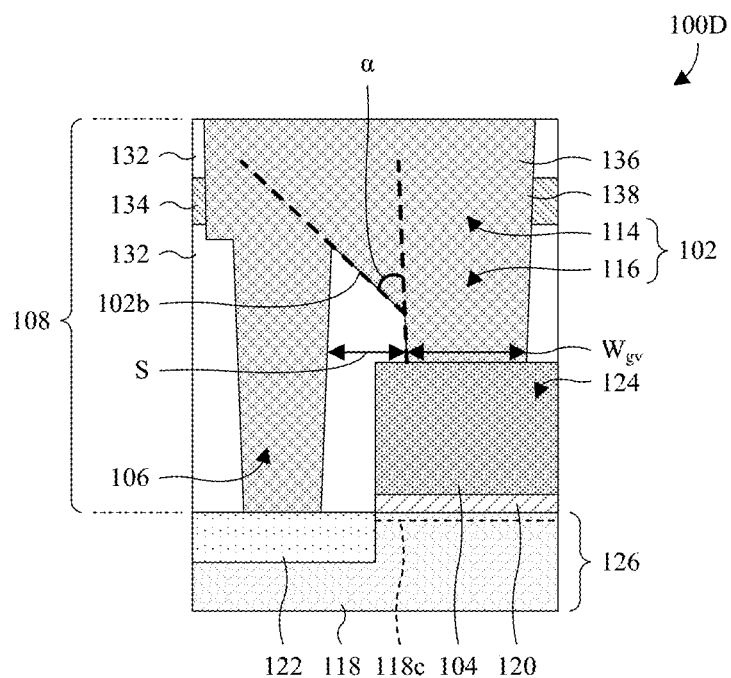

With reference to FIG. 1D, a cross-sectional view 100D of some alternative embodiments of the IC of FIG. 1A is provided in which the barrier 138 is omitted. As discussed with regard to FIG. 1B, omitting the barrier 138 may reduce resistance from the gate contact 116 to the gate electrode 104.

Figure 2A:
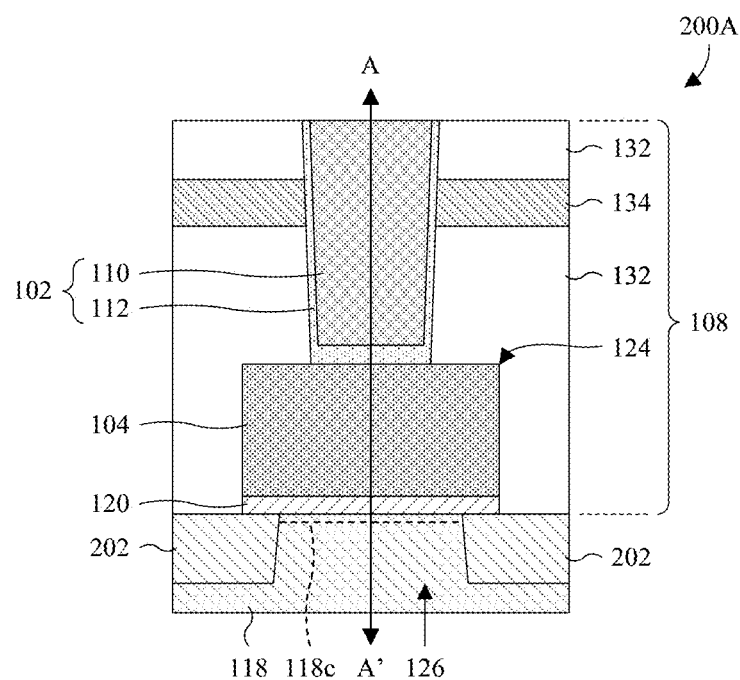
FIGS. 2A and 2B illustrate cross-sectional views of various embodiments of the IC of FIG. 1A that are orthogonal to the cross-sectional view of FIG. 1A FIGS. 3A and 3B illustrate cross-sectional views of various alternative embodiments of the IC of FIG. 1A in which the GC structure neighbors a plurality of semiconductor devices and a plurality of AR contacts.

With reference to FIG. 2A, a cross-sectional view 200A of some embodiments of the IC of FIG. 1A is provided in which the semiconductor device 124 is a planar FET. The cross-sectional view 200A of FIG. 2A is orthogonal to the cross-sectional view 100A of FIG. 1A, and the cross-sectional view 100A of FIG. 1A may, for example, be taken along line A-A' in FIG. 2A. Hence, the cross-sectional view 100A of FIG. 1A extends into and out of the page.

The gate electrode 104 and the gate dielectric layer 120 have substantially planar profiles and partially overlie a trench isolation structure 202. The trench isolation structure 202 has a pair of segments respectively on opposite sides of the channel region 118c and demarcates the active region 126 of the semiconductor device 124. The trench isolation structure 202 may, for example, be or comprise silicon oxide and/or some other suitable dielectric material(s). Further, the trench isolation structure 202 may, for example, be or comprise a STI structure or some other suitable trench isolation structure.

Figure 2B:
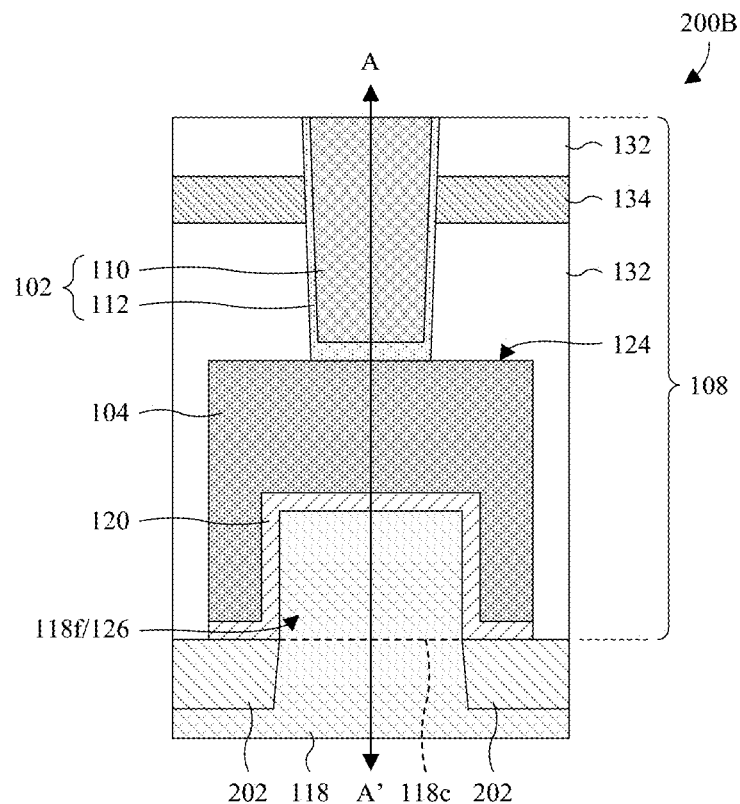

With reference to FIG. 2B, a cross-sectional view 200B of some alternative embodiments of the IC of FIG. 2A is provided in which the semiconductor device 124 is a fin FET (finFET). Similar to FIG. 2A, the cross-sectional view 100A of FIG. 1A may, for example, be taken along line A-A' in FIG. 2B. The gate electrode 104 and the gate dielectric layer 120 wrap around a top of a fin 118f of the substrate 118. The fin 118f protrudes upward and has a top surface elevated above a top surface of the trench isolation structure 202. Further, the fin 118f at least partially defines the active region 126 of the semiconductor device 124.

While the semiconductor device 124 is illustrated as a planar FET and a finFET respectively in FIGS. 2A and 2B, the semiconductor device 124 may be some other suitable type of transistor or semiconductor device. Hence, the GC structure 102 is not limited to use with the embodiments of the semiconductor device 124 illustrated in FIGS. 2A and 2B. For example, the semiconductor device 124 may be a gate-all-around (GAA) FET or some other suitable transistor. The GAA FET may, for example, employ round/square nano wires, horizontal nano slabs, horizontal nanosheets, hexagonal nano wires, nano rings, or some other suitable nano structures for individual channel regions. Additionally, while FIGS. 2A and 2B are described with regard to FIG. 1A, the teachings in FIGS. 2A and 2B are applicable to any one of FIGS. 1B-1D. For example, FIG. 1C may alternatively be taken along line A-A' in FIGS. 2A and 2B. As another example, the GC barrier 112 may be omitted in alternative embodiments of FIGS. 2A and 2B and any one of FIGS. 1B and 1D may be taken along line A-A' in these alternative embodiments.

Figure 3A:
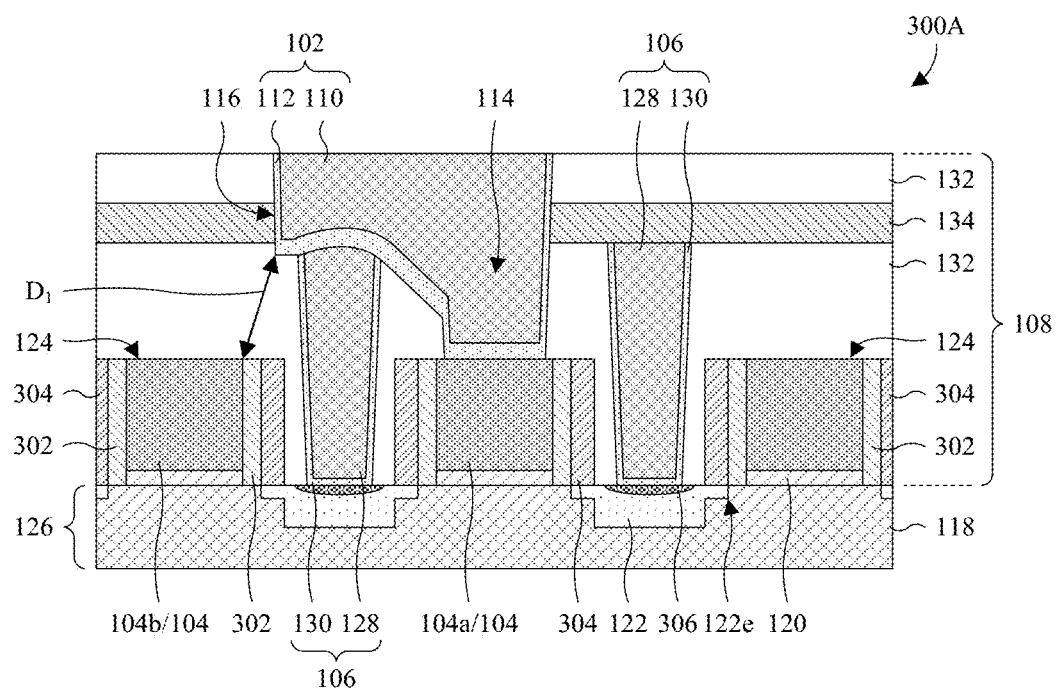

With reference to FIG. 3A, a cross-sectional view 300A of some alternative embodiments of the IC of FIG. 1A is provided in which the GC structure 102 neighbors a plurality of semiconductor devices 124 and a plurality of AR contacts 106. The semiconductor devices 124 and the AR contacts 106 are as their counterparts are described in FIG. 1A. For example, the semiconductor devices 124 each comprise a gate electrode 104, a gate dielectric layer 120, etc. As another example, the AR contacts 106 each comprise an AR plug 128 and an AR barrier 130. Further, the semiconductor devices 124 share source/drain regions 122. In alternative embodiments, at least one of the semiconductor devices 124 has an individual source/drain region.

The GC structure 102 overlies a first gate electrode 104a and is separated from a second gate electrode 104b by a distance $D_1$. Because the gate contact 116 is elevated above the second gate electrode 104b by the gate via 114, the distance $D_1$ is larger than it would be if the gate contact 116 was directly on the first gate electrode 104a. As such, the likelihood of leakage current and/or electrical coupling from the gate contact 116 to the second gate electrode 104b is low.

In some embodiments, the distance $D_1$ is about 5-25 nanometers, about 5-15 nanometers, about 15-25 nanometers, about 10-25 nanometers, greater than about 10 nanometers, or some other suitable value. If the distance $D_1$ is too small (e.g., less than about 5 nanometers or some other suitable value), leakage current may be high from the gate contact 116 to the second gate electrode 104b and/or the likelihood of electrical coupling from the gate contact 116 to the second gate electrode 104b may be high. If the distance $D_1$ is too large (e.g., greater than about 25 nanometers or some other suitable value), an aspect ratio of the gate via 114 may be high. As discussed above with regard to FIG. 1A, a high aspect ratio at the gate via 114 increases the likelihood of seams or voids forming at the gate via 114. Such seams and voids would increase the resistance from the gate contact 116 to the first gate electrode 104a and could hence shift operating parameters of the IC out of specification and/or increase power consumption.

With continued reference to FIG. 3A, inner sidewall spacers 302 are on sidewalls of the gate electrodes 104 and outer sidewall spacers 304 are on sidewalls of the inner sidewall spacers 302. Further, silicide layers 306 separate the AR contacts 106 from the source/drain regions 122 and source/drain extensions 122e protrude outward from the source/drain regions 122. In alternative embodiments, the source/drain extensions 122e are omitted. The source/drain extensions 122e underlie the outer sidewall spacers 304 and may, for example, have a lesser doping concentration than a remainder of the source/drain regions 122. The inner and outer sidewall spacers 302, 304 may, for example, be or comprise silicon oxide, silicon nitride, silicon carbide, silicon oxynitride, some other suitable dielectric(s), or any combination of the foregoing. In some embodiments, the inner and outer sidewall spacers 302, 304 are different materials. In other embodiments, the inner and outer sidewall spacers 302, 304 are the same material.

Figure 3B:
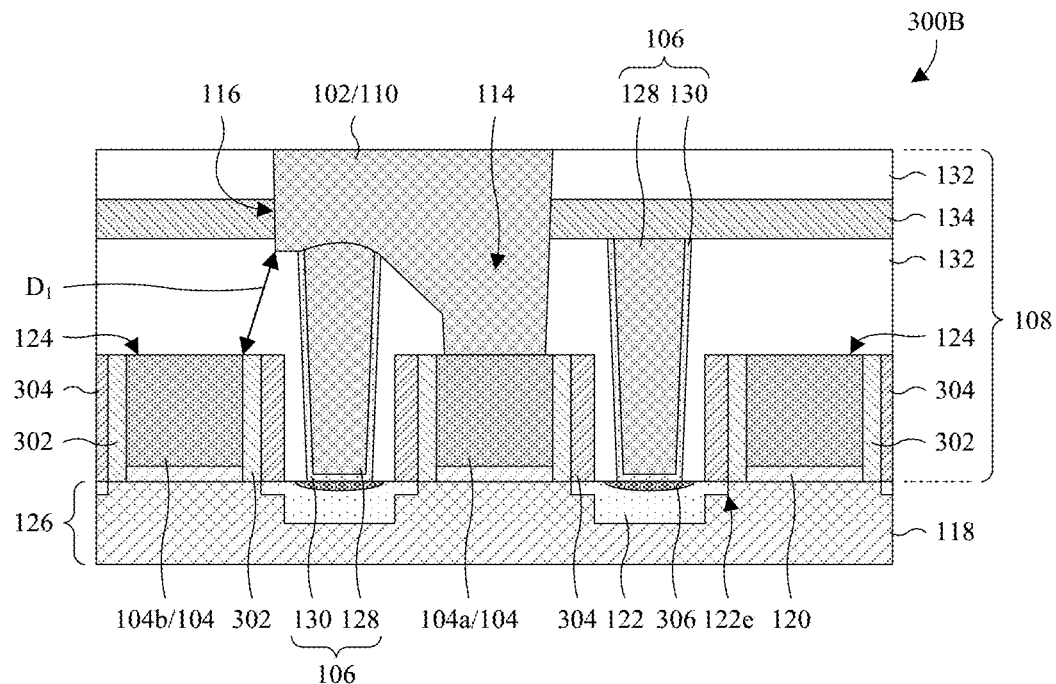

With reference to FIG. 3B, a cross-sectional view 300B of some alternative embodiments of the IC of FIG. 3A is provided in which the GC structure 102 is configured as in FIG. 1B and the GC barrier 112 is omitted. In yet other alternative embodiments of the IC of FIG. 3A, the GC structure 102 and/or the AR contacts 106 is/are as in any one of FIGS. 1C and 1D.

Figure 4A:
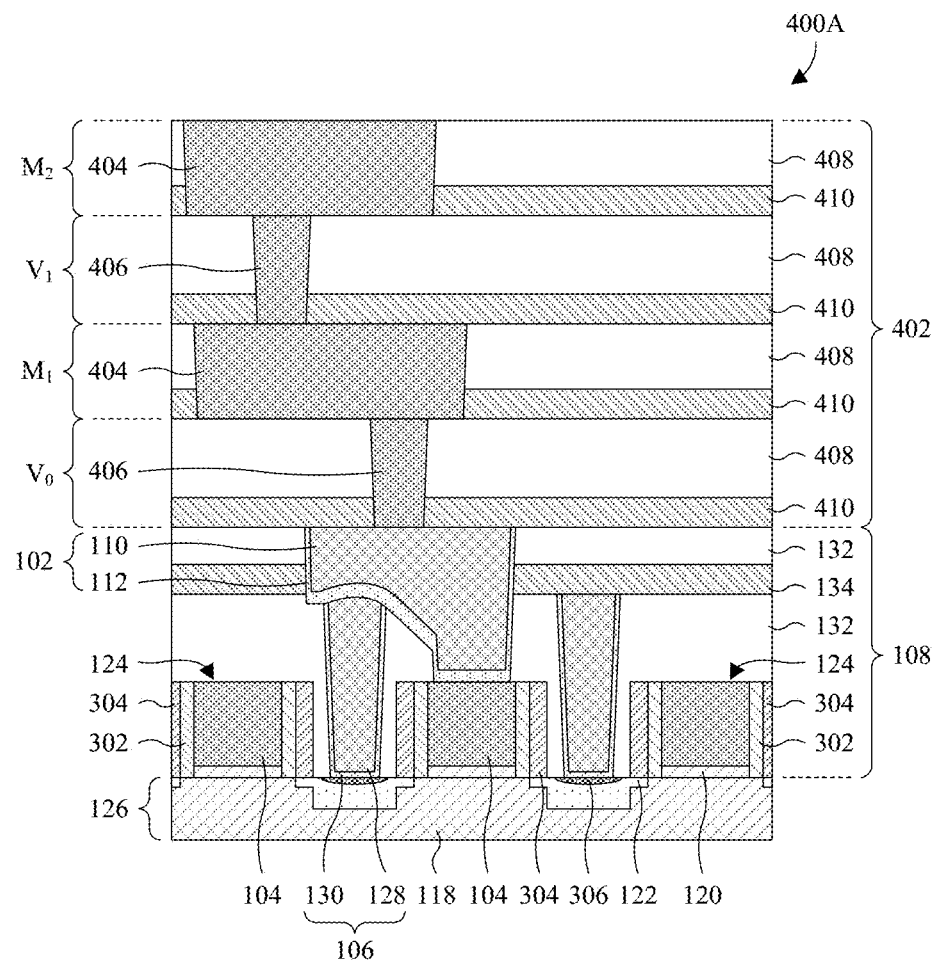
FIGS. 4A and 4B illustrate expanded cross-sectional views of various embodiments of the IC of FIG. 3A in which a back-end-of-line (BEOL) region overlies a middle-of-the-line (MOL) region in which the GC structure is arranged.

With reference to FIG. 4A, a cross-sectional view 400A of some embodiments of the IC of FIG. 3A is provided in which a BEOL region 402 overlies and is electrically coupled to the MOL region 108. The BEOL region 402 is partially shown and includes a plurality of interconnect wires 404 and a plurality of interconnect vias 406 in a plurality of additional ILD layers 408 and a plurality of additional etch stop layers 410.

The plurality of interconnect wires 404 are grouped into a plurality of wire levels above the substrate 118, and the plurality of interconnect vias 406 are grouped into a plurality of via levels above the substrate 118. The plurality of wire levels and the plurality of via levels are alternatingly stacked to define conductive paths leading from the MOL region 108. Further, the plurality of wire levels includes a first wire level $M_1$ and a second wire level $M_2$, and the plurality of via levels includes a zeroth via level $V_0$ and a first via level $V_1$. In some embodiments, one or more additional wire level(s) (not shown) and/or one or more additional via level(s) overlie and electrically couple to the second wire level $M_2$.

Figure 4B:
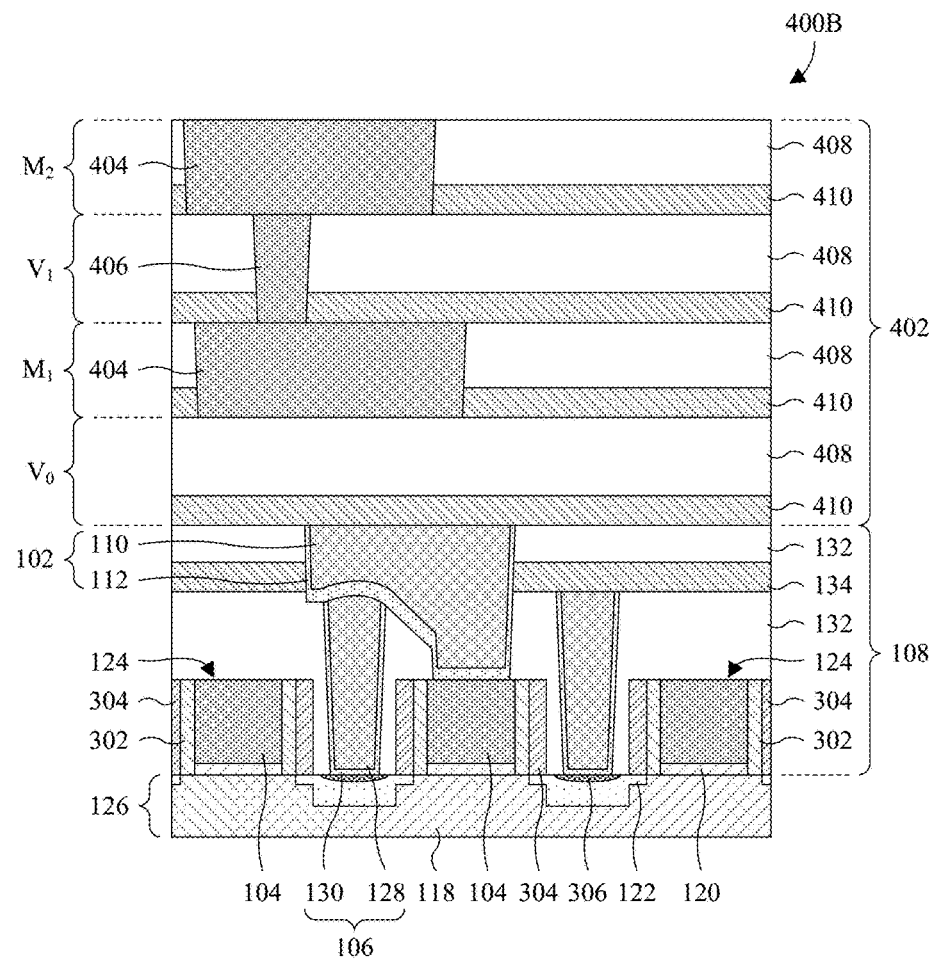

With reference to FIG. 4B, a cross-sectional view 400B of some alternative embodiments of the IC of FIG. 4A is provided in which the GC structure 102 is electrically isolated from the BEOL region 402. In other words, the GC structure 102 is completely spaced from interconnect vias in the zeroth via level $V_0$. In some embodiments, a top surface of the GC structure 102 directly contacts a corresponding one of the additional etch stop layers 410 across an entirety of the top surface.

The embodiments of FIG. 4B may, for example, arise when the GC structure 102 is used for static random-access memory (SRAM) or the like, whereas the embodiments of FIG. 4A may, for example, arise when the GC structure 102 is used for logic or the like. Further, the GC structure 102 and/or the AR contacts 106 may, for example, be as in any one of FIGS. 1B-1D in alternative embodiments of FIGS. 4A and 4B.

Figure 5A:
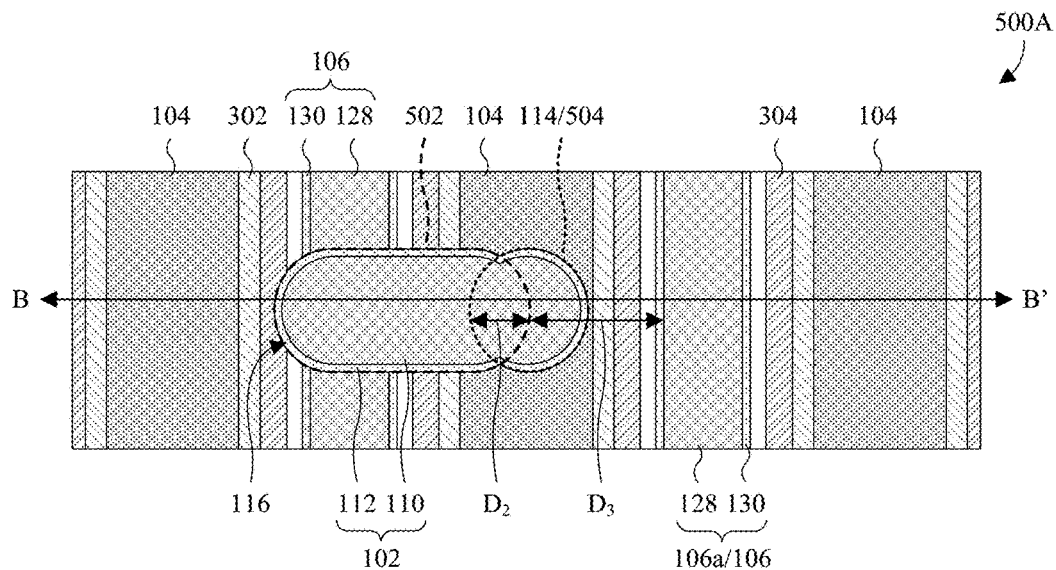
FIGS. 5A-5D illustrate top layouts of various embodiments of the IC of FIG. 3A.

With reference to FIG. 5A, a top layout 500A of some embodiments of the IC of FIG. 3A is provided. The IC of FIG. 3A may, for example, be taken along line B-B' in FIG. 5A. The GC structure 102 has rounded edges and, as described hereafter, is formed from the overlay between a contact pattern 502 and a via pattern 504. The contact pattern 502 is used to form the gate contact 116 and is elongated along line B-B'. The via pattern 504 is used to form the gate via 114 and is circular. Other shapes for the contact pattern 502 and/or the via pattern 504 are, however, amenable. The contact pattern 502 and the via pattern 504 overlap by a distance $D_2$ and the contact pattern 502 is separated from a first AR contact 106a by a distance $D_3$.

In some embodiments, the distance $D_2$ is about 5-25 nanometers, about 5-15 nanometers, about 15-25 nanometers, about 3-25 nanometers, greater than about 3 nanometers, or some other suitable value. If the distance $D_2$ is too small (e.g., less than about 3 nanometers or some other suitable value), electrical coupling between the gate contact 116 and the gate via 114 may be poor and/or otherwise fail. Such poor electrical coupling may, for example, limit the amount of current that may pass from the gate contact 116 to the gate via 114 and/or shift operating parameters of the IC out of specification. If the distance $D_2$ is too large (e.g., greater than about 25 nanometers or some other suitable value), the contact pattern 502 may extend beyond the via pattern 504 and the distance $D_3$ may be too small (see below).

In some embodiments, the distance $D_3$ is about 5-25 nanometers, about 5-15 nanometers, about 15-25 nanometers, about 3-25 nanometers, greater than about 3 nanometers, or some other suitable value. If the distance $D_3$ is too small (e.g., less than about 3 nanometers or some other suitable value), leakage current may be high between the gate contact 116 and the first AR contact 106a and/or the gate contact 116 and the first AR contact 106a may electrically couple. If the distance $D_3$ is too large (e.g., greater than about 25 nanometers or some other suitable value), device scaling may be needlessly hindered and/or the distance $D_2$ may be too small.

Because of the gate via 114, the risk of the distance $D_2$ and the risk of the distance $D_3$ being too small and/or too large are reduced. During formation of the GC structure 102, a via opening with the via pattern 504 is first formed and then a contact opening with the contact pattern 502 is formed overlapping with the via opening. Hence, the via pattern 504 provides a buffer laterally between the contact pattern 502 and the first AR contact 106a. The buffer reduces the likelihood of the contact pattern 502 getting too close to the first AR contact 106a (see, e.g., the distance $D_3$). As such, the likelihood of leakage current and/or electrical shorting is reduced. Further, the buffer allows the contact pattern 502 to get closer to the first AR contact 106a than would otherwise be possible. As such, overlay between the contact pattern 502 and the via pattern 504 (see, e.g., the distance $D_2$) is robust (e.g., has a large overlay window).

Figure 5B:
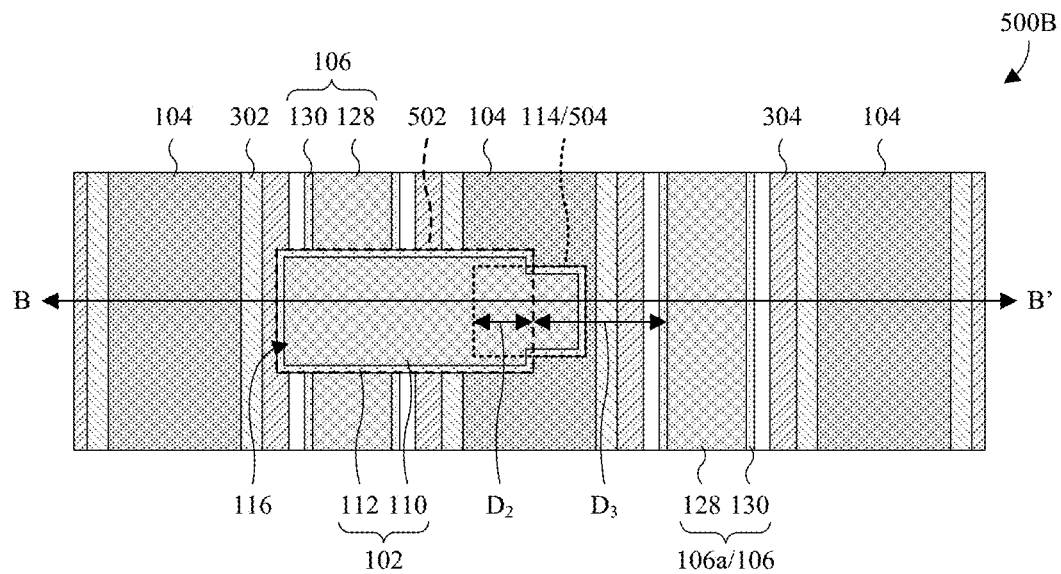
Figure 5C:
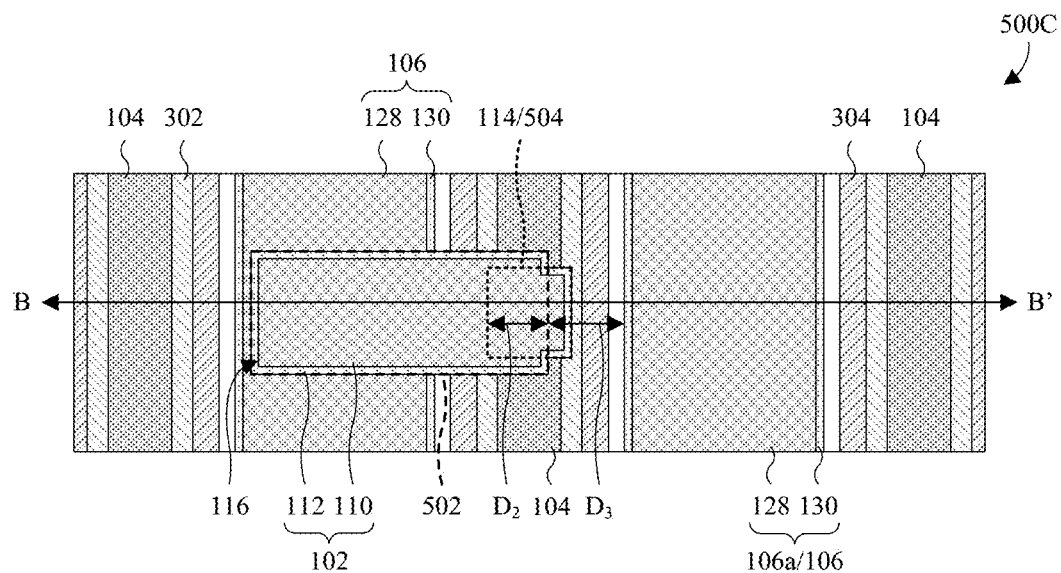

With reference to FIGS. 5B and 5C, top layouts 500B and 500C of some alternative embodiments of the IC of FIG. 5A are provided in which edges of the GC structure 102 are substantially square. Further, the contact pattern 502 and the via pattern 504 are rectangular or square shaped. As between the top layouts 500B and 500C of FIGS. 5B and 5C, widths of the AR contacts 106 are less than widths of the gate electrodes 104 in FIG. 5B and are greater than the widths of the gate electrodes 104 in FIG. 5C.

Figure 5D:
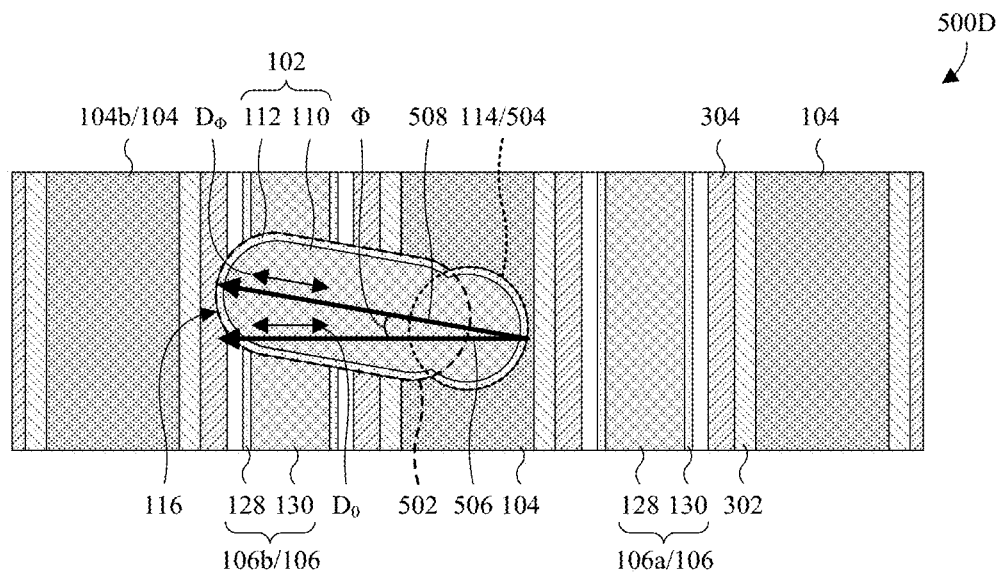

With reference to FIG. FIG. 5D, a top layout 500D of some alternative embodiments of the IC of FIG. 5A is provided in which the GC structure 102 is at an angle Φ. The angle Φ is relative to a reference axis 506, which is perpendicular to a direction along which the gate electrodes 104 and the AR contacts 106 are elongated. The angle Φ may, for example, be less than about 30 degrees, less than about 20 degrees, less than about 10 degrees, or some other angle.

In some embodiments, by orienting the GC structure 102 at the angle Φ, the contact pattern 502 may extend a greater distance over the second AR contact 106b, along its central axis 508, without getting too close to the second gate electrode 104. For example, a distance $D_\Phi$ along the central axis 508 may be equal to a distance $D_0$ along the reference axis 506 divided by COS(Φ) (e.g., $D_\Phi=D_0/\text{COS}(\Phi)$), such that $D_\Phi$ may greater than $D_0$. Because the contact pattern 502 may extend a greater distance over the second AR contact 106b, the likelihood of landing the contact pattern 502 and hence the gate contact 116 on the second AR contact 106b may be increased. In some embodiments, by orienting the GC structure 102 at the angle Φ, the likelihood of landing the contact pattern 502 and hence of the gate contact 116 on the gate via 114 may be increased. This may, for example, be for the same reasons described above.

Notwithstanding the specific shapes illustrated for the GC structure 102, the contact pattern 502, and the via pattern 504 in FIGS. 5A-5D, other shapes are amenable in alternative embodiments. Further, the GC structure 102 and/or the AR contacts 106 may, for example, be as in any one of FIGS. 1B-1D in alternative embodiments of FIGS. 5A-5D. For example, the GC barrier 112 may be omitted in alternative embodiments of FIGS. 5A-5D.

Figure 6A:
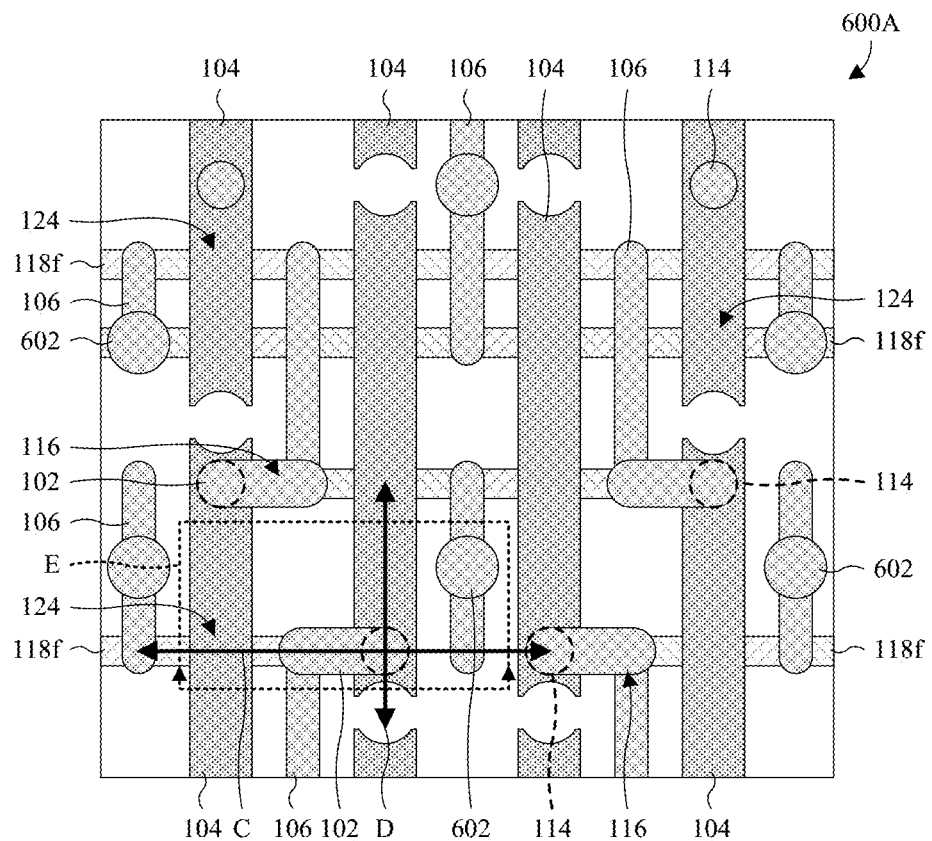
FIGS. 6A and 6B illustrate top layouts of various embodiments of an IC comprising a plurality of GC structures neighboring a plurality of AR contacts and a plurality of semiconductor devices configured as fin field-effect transistors (finFETs).

With reference to FIG. 6A, a top layout 600A of some embodiments of an IC comprising a plurality of GC structures 102 is provided in which the GC structures 102 are on a plurality of AR contacts 106 and a plurality of semiconductor devices 124 configured as finFETs. The GC structures 102, the AR contacts 106, and the semiconductor devices 124 may, for example, be as their counterparts are described in any one or combination of FIGS. 1A-1D, 2B, 3A, 3B, 4A, 4B, and 5A-5D. In some embodiments, any of FIGS. 1A-1D, 3A, 3B, 4A, and 4B is taken along line C and/or FIG. 2B is taken along line D.

A plurality of a fins 118f is defined by a substrate (see, e.g., 118 in FIG. 2B), and the fins 118f are elongated in parallel in a first direction. A plurality of gate electrodes 104 and the plurality of AR contacts 106 are elongated in parallel in a second direction orthogonal to the first direction. The first and second directions may, for example, respectively be an X direction and a Y direction or vice versa. The gate electrodes 104 respectively overlie (when viewed in cross section) and straddle the fins 118f. Similarly, the AR contacts 106 respectively overlie (when viewed in cross section) and straddle the fins 118f at source/drain regions (not shown; see, e.g., 122 in FIG. 1A) on and/or partially defined by the fins 118f. In alternative embodiments, at least one of the AR contacts 106 is at another location (e.g., other than a source/drain region) in an active region for a corresponding one of the semiconductor devices 124.

The fins 118f and the gate electrodes 104 partially define the semiconductor devices 124. The GC structures 102 are on the semiconductor devices 124 and extend from corresponding gate electrodes 104 to corresponding AR contacts 106 to provide electrically coupling therebetween. The GC structures 102 comprise corresponding gate vias 114 and corresponding gate contacts 116. The gate vias 114 vertically separate the gate contacts 116 from the gate electrodes 104. As described above, the gate vias 114 allow the GC structures 102 to be more robustly formed and reduce leakage current.

With continued reference to FIG. 6A, a plurality of AR vias 602 is on some of the AR contacts 106. Further, a plurality of additional gate vias 114 is separate from the GC structures 102 and is on the gate electrodes 104. In some embodiments, the AR vias 602 are a single material throughout, whereas the additional gate vias 114 comprise multiple materials. For example, the AR vias 602 may lack a barrier, whereas the additional gate vias 114 may comprise corresponding barriers and corresponding plugs. See, e.g., 110 and 112 in FIG. 1A.

Figure 6B:
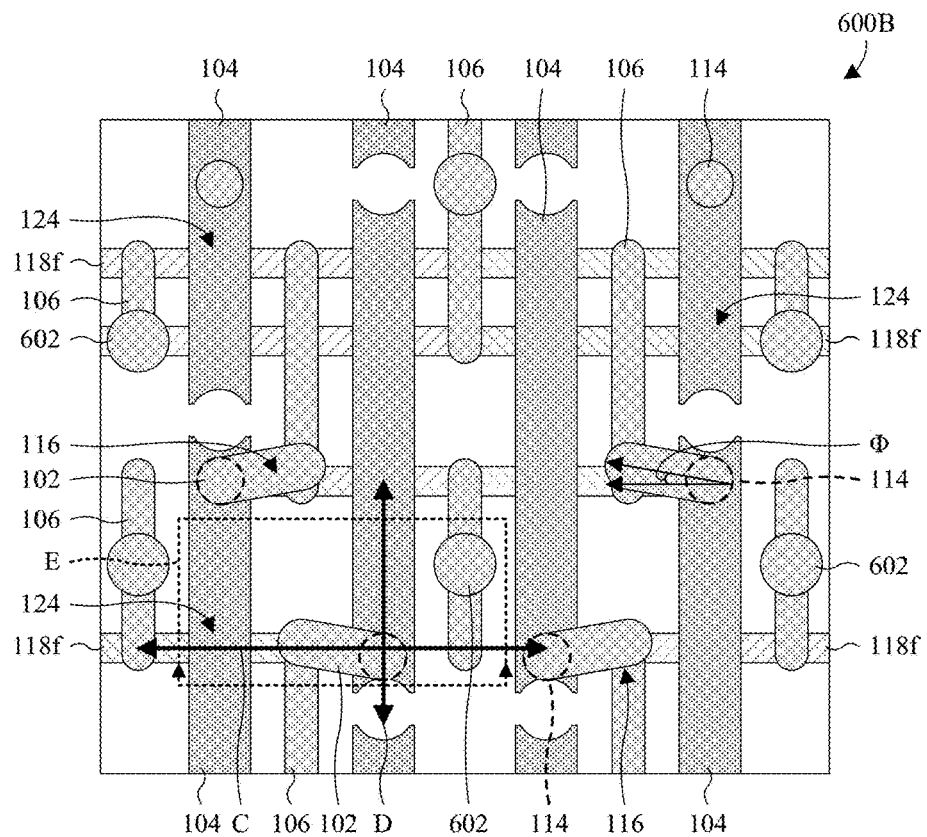

With reference to FIG. 6B, a top layout 600B of some alternative embodiments of the IC of FIG. 6A is provided in which the GC structures 102 are orientated at an angle Φ. The angle Φ is relative to a reference axis, which is parallel to a direction along which the fins 118f are elongated and/or is perpendicular to a direction along which the gate electrodes 104 and the AR contacts 106 are elongated. As described and explained with regard to FIG. 5D, the angle Φ may, for example, increase the likelihood of landing the gate contacts 116 on corresponding AR contacts 106 and/or corresponding gate vias 114. In other words, angle Φ may, for example, increase the landing window for the gate contact 116.

Figure 7:
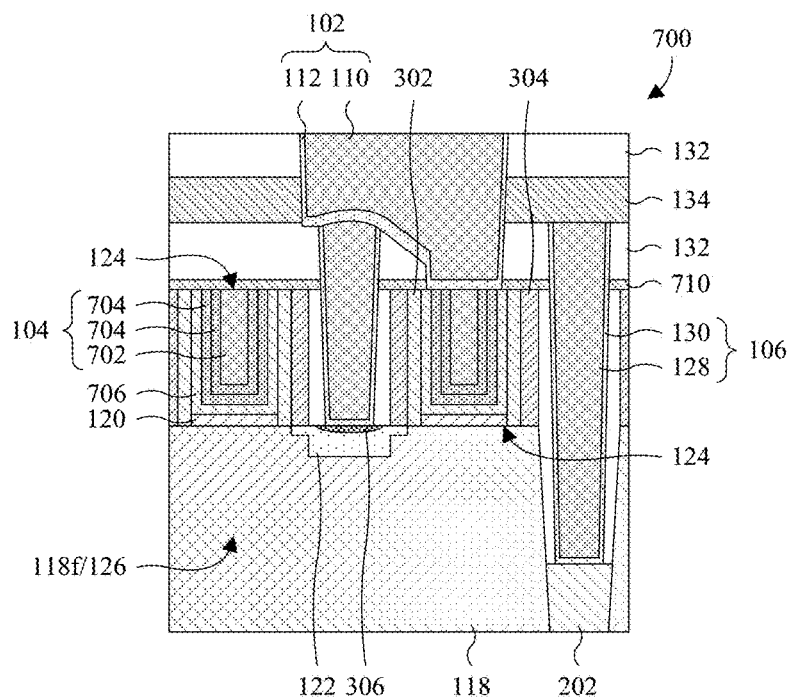
FIG. 7 illustrates a cross-sectional view of some embodiments of the IC of FIG. 6A.

With reference to FIG. 7, a cross-sectional view 700 of some embodiments of the IC of FIG. 6A is provided along line C in FIG. 6A. Semiconductor devices 124 are on a fin 118f of a substrate 118 and comprise corresponding gate electrodes 104, corresponding high k dielectric layers 706, and corresponding gate dielectric layers 120. Note that the high k dielectric layers 706 may also be construed as gate dielectric layers. The gate electrodes 104 comprise corresponding metal plugs 702 and corresponding work function layers 704 cupping undersides of the metal plugs 702. The high k dielectric layers 706 cup undersides of the work function layers 704 and separate the work function layers 704 from the gate dielectric layers 120.

A GC structure 102 is on a corresponding one of the semiconductor devices 124 and a corresponding one of the AR contacts 106. The GC structure 102 comprises a GC plug 110 and a GC barrier 112 cupping an underside of the GC plug 110. In alternative embodiments, the GC barrier 112 is omitted as in FIG. 1B. The corresponding one of the AR contacts 106 extends from the GC structure 102 to a silicide layer 306 on a source/drain region 122. Another one of the AR contacts 106 is to a right side of the GC structure 102 and extends below a top surface of the fin 118f to a trench isolation structure 202. A cap layer 710 covers the semiconductor devices 124 between the gate electrodes 104 and a neighboring one of the ILD layers 132. The cap layer 710 may be or comprise, for example, silicon nitride and/or some other suitable dielectric(s).

Figure 8:
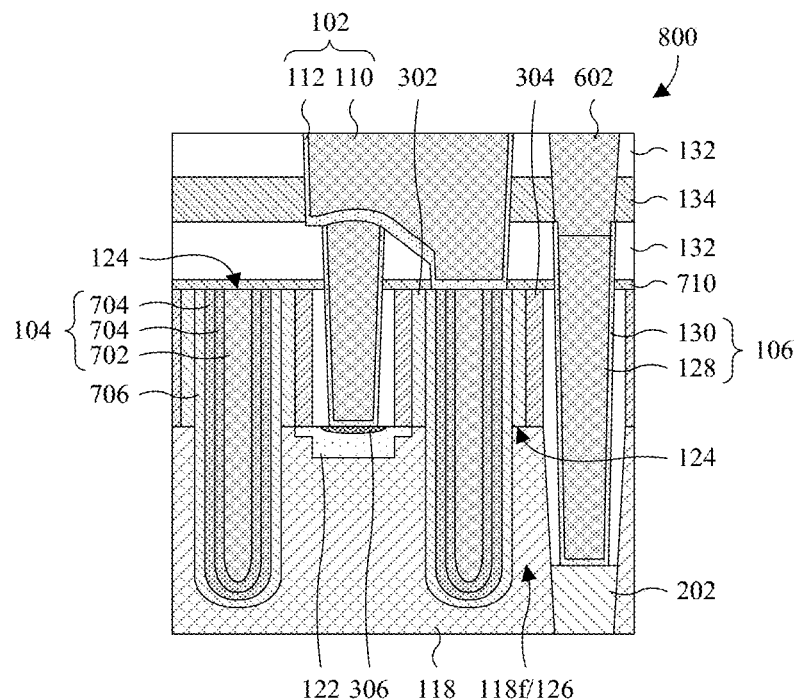
FIG. 8 illustrates a cross-sectional projection of some embodiments of the IC of FIG. 6A.

With reference to FIG. 8, a cross-sectional projection 800 of some embodiments of the IC of FIG. 6A is provided within box E of FIG. 6A. The cross-sectional projection 800 is a projection of the portion of FIG. 6A within box E onto a two-dimensional (2D) plane in the direction shown by the arrows on box E. As such, the cross-sectional projection 800 is similar to the cross-sectional view 700 of FIG. 7, except that it shows the overlap between features within different cross-sectional planes. For example, an AR via 602 is shown bordering the GC structure 102 on a corresponding one of the AR contacts 106 even though the AR via 602 and the GC structure 102 may be in different cross-sectional planes. As another example, the gate electrodes 104 are shown extending below a top surface of the fin 118b in the same cross-sectional plane as the GC structure 102 even though this extension may be in a different cross-sectional plane.

With reference to FIGS. 9-16, 17A, and 17B, a series of cross-sectional views 900-1600, 1700A, and 1700B of some embodiments of a method for forming an IC comprising a GC structure is provided. The cross-sectional views 900-1600, 1700A, and 1700B correspond to the cross-sectional view 300A of FIG. 3A and therefore illustrate formation of the IC and the GC structure 102 in FIG. 3A. However, the method illustrated by the cross-sectional views 900-1600, 1700A, and 1700B may also be employed to form the IC and/or the GC structure 102 in any of FIGS. 1A, 2A, 2B, 4A, 4B, 5A-5D, 6A, 6B, 7, and 8.

Figure 9:
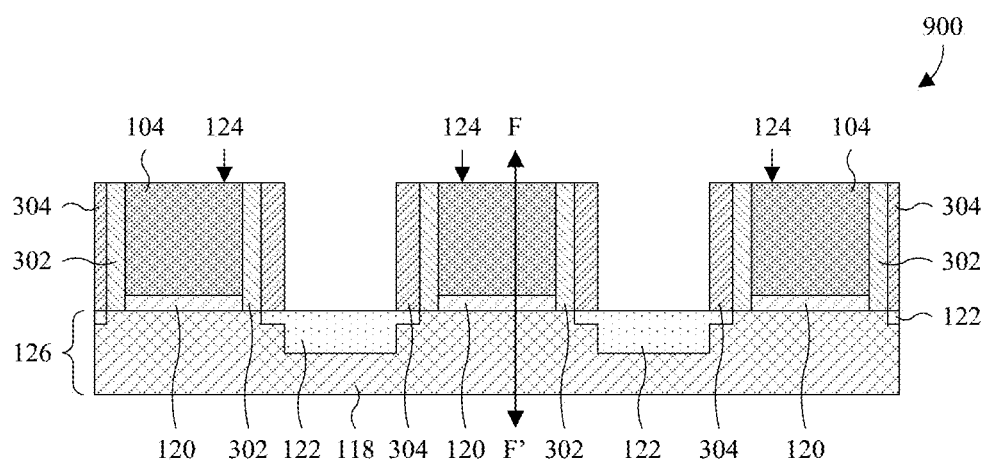
FIGS. 9-16, 17A, 17B, and 18A-18C illustrate a series of cross-sectional views of various embodiments of a method for forming an IC comprising a GC structure.

As illustrated by the cross-sectional view 900 of FIG. 9, a plurality of semiconductor devices 124 is provided or otherwise formed over a substrate 104. The semiconductor devices 124 comprise corresponding gate electrodes 104 and corresponding gate dielectric layers 120 separating the gate electrodes 104 from the substrate 118. Further, the semiconductor devices 124 share corresponding source/drain regions 122 laterally between the gate electrodes 104. In alternative embodiments, at least one of the semiconductor devices 124 has an individual source/drain region. The source/drain regions 122 may, for example, be doped regions of the substrate 118 and/or epitaxial layers formed sunken into a top of the substrate 118. The source/drain regions 122 and top portions of the substrate 118 underlying the semiconductor devices 124 at least partially define an active region 126.

In some embodiments, the semiconductor devices 124 are planar FETs and/or each have the same cross-sectional profile as their counterpart in FIG. 2A. For example, a cross-sectional profile of a semiconductor device taken along line F-F' may be as its counterpart in FIG. 2A. In alternative embodiments, the semiconductor devices 124 are finFETs and/or each have the same cross-sectional profile as their counterpart in FIG. 2B. For example, a cross-sectional profile of a semiconductor devices taken along line F-F' may be as its counterpart in FIG. 2B. In yet other alternative embodiments, the semiconductor devices 124 are GAA transistors, some other suitable transistors, memory cells, or some other suitable semiconductor devices.

Also illustrated by the cross-sectional view 900 of FIG. 9, a plurality of inner sidewall spacers 302 and a plurality of outer sidewall spacers 304 are formed. The inner sidewall spacers 302 are respectively formed on sidewalls of the gate electrodes 104. The outer sidewall spacers 304 are respectively formed on sidewalls of the inner sidewall spacers 302 and are respectively formed overlying the source/drain regions 122.

Figure 10:
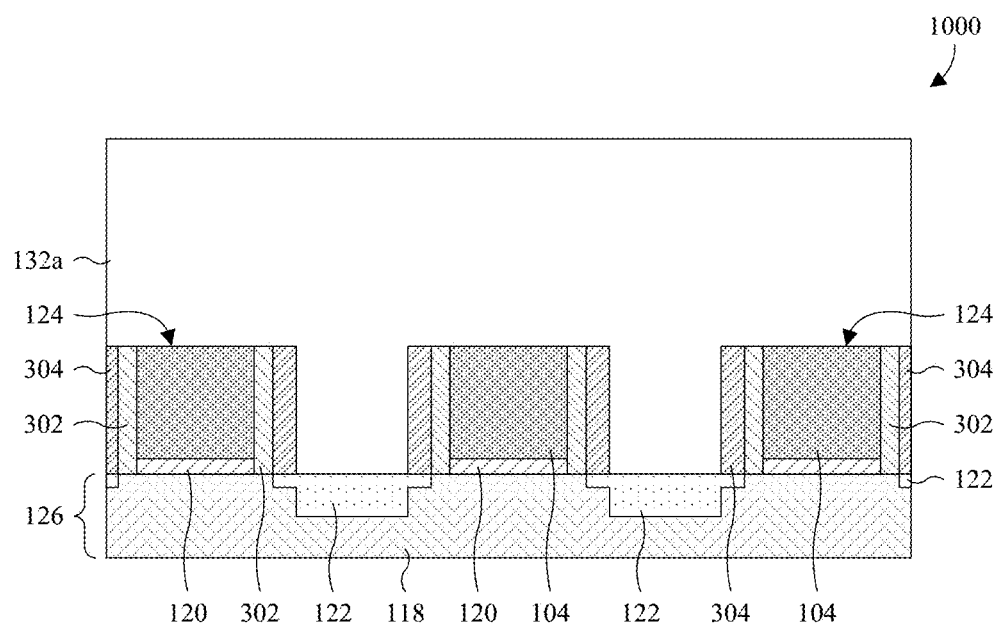

As illustrated by the cross-sectional view 1000 of FIG. 10, a first ILD layer 132a is formed over the semiconductor devices 124 and the substrate 118. Further, the first ILD layer 132a is formed with a top surface that is flat or substantially flat. A process for forming the first ILD layer 132a may, for example, comprise depositing the first ILD layer 132a and subsequently performing a planarization into the top surface the first ILD layer 132a. Other processes are, however, amenable. The planarization may, for example, be or comprise a chemical mechanical polish (CMP) and/or some other suitable planarization process.

Figure 11:
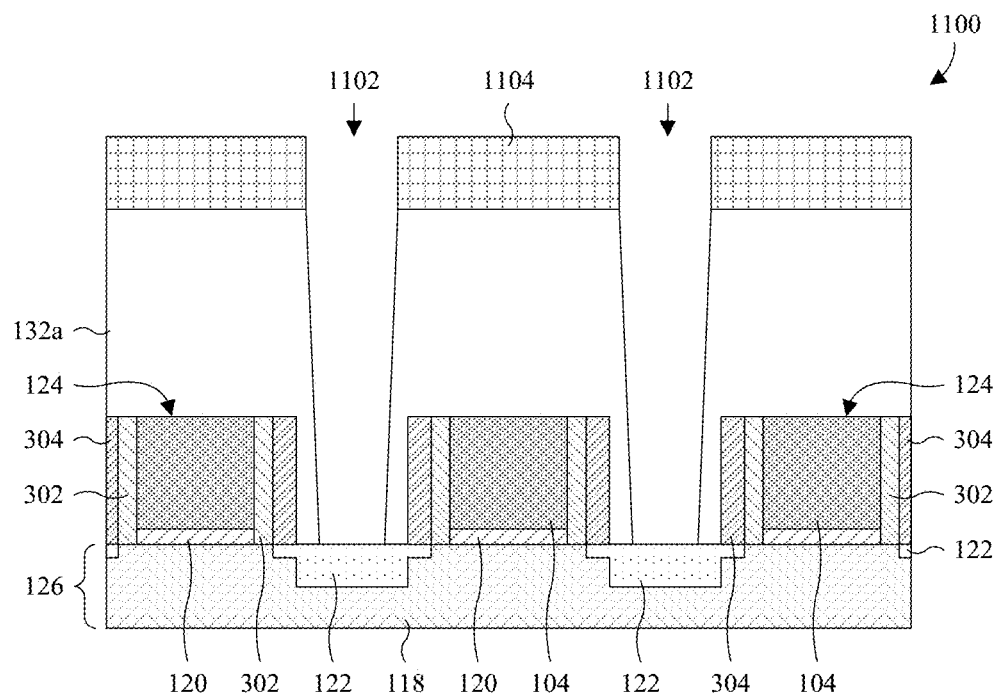

As illustrated by the cross-sectional view 1100 of FIG. 11, a first etch is performed into the first ILD layer 132a to form a plurality of AR openings 1102. The AR openings 1102 expose at least some of the source/drain regions 122 and/or some other suitable location(s) in the active region 126. In some embodiments, the AR openings 1102 have top layouts that are laterally elongated and/or that overlie multiple fins of finFETs. A non-limiting example of such top layouts may, for example, be found through reference to the AR contacts 106 in FIG. 6A and/or FIG. 6B. In alternative embodiments, the AR openings 1102 have top layouts that are circular, square, or some other suitable shape. A process for performing the first etch may, for example, comprise forming a first mask 1104 on the first ILD layer 132a, etching the first ILD layer 132a with the first mask 1104 in place, and removing the first mask 1104. Other processes are, however, amenable. The first mask 1104 may, for example, be photoresist and/or some other suitable mask material(s).

Figure 12:
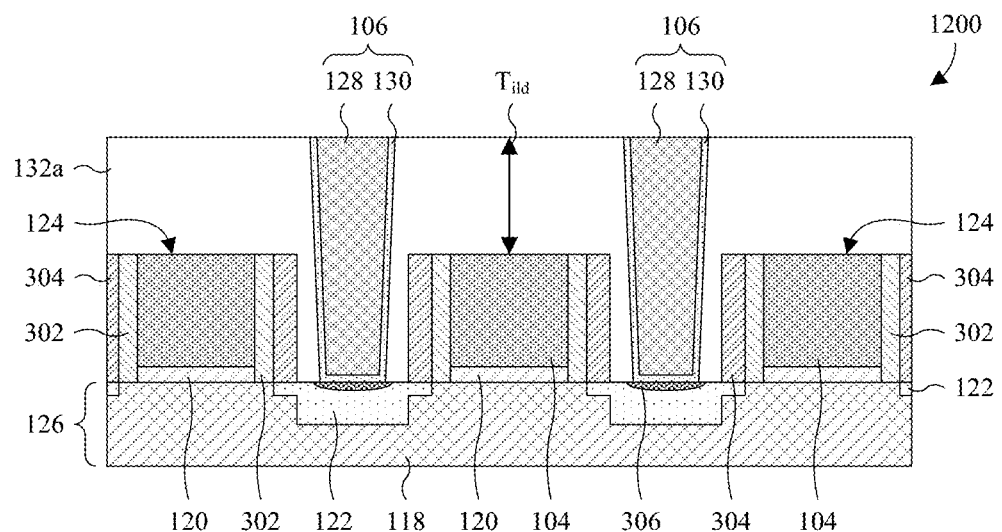

As illustrated by the cross-sectional view 1200 of FIG. 12, silicide layers 306 are formed on the active region 126 at bottoms of the AR openings 1102 (see, e.g., FIG. 11). For example, the silicide layers 306 may be formed on source/drain regions 122 in the AR openings 1102. The silicide layers 306 are or comprise a metal silicide. The silicide layers 306 may, for example, be formed by a salicide process or some other suitable process for forming metal silicide.

Also illustrated by the cross-sectional view 1200 of FIG. 12, AR contacts 106 are formed filling the AR openings 1102 (see, e.g., FIG. 11) over the silicide layers 306. The AR contacts 106 comprise corresponding AR plugs 128 and corresponding AR barriers 130 cupping undersides of the AR plugs 128. A process for forming the AR contacts 106 may, for example, comprise: 1) depositing a barrier layer that covers the first ILD layer 132a and that lines and partially fills the AR openings 1102; 2) depositing a plug layer covering the barrier layer and filling a remainder of the AR openings 1102; and 3) performing a planarization into the barrier layer, the plug layer, and the first ILD layer 132a until top surfaces thereof are about even. Other processes for forming the AR contacts 106 are, however, amenable. The planarization thins the first ILD layer 132a to a thickness $T_{ild}$ and separates the plug and barrier layers respectively into the AR plugs 128 and the AR barriers 130. Further, the planarization may, for example, be or comprise a CMP and/or some other suitable planarization process.

In some embodiments, the thickness $T_{ild}$ of the first ILD layer 132a is about 8-25 nanometers, about 8-16.5 nanometers, about 16.5-25 nanometers, or some other suitable value directly over the gate electrodes 104. If the thickness $T_{ild}$ is too small (e.g., less than about 8 nanometers or some other suitable value), the likelihood of a subsequently formed gate contact getting too close to a neighboring gate electrode becomes high. This, in turn, increases the likelihood of leakage current and/or electrical shorting that may lead to device failure. If the thickness $T_{ild}$ is too large (e.g., greater than about 25 nanometers), material is wasted.

Figure 13:
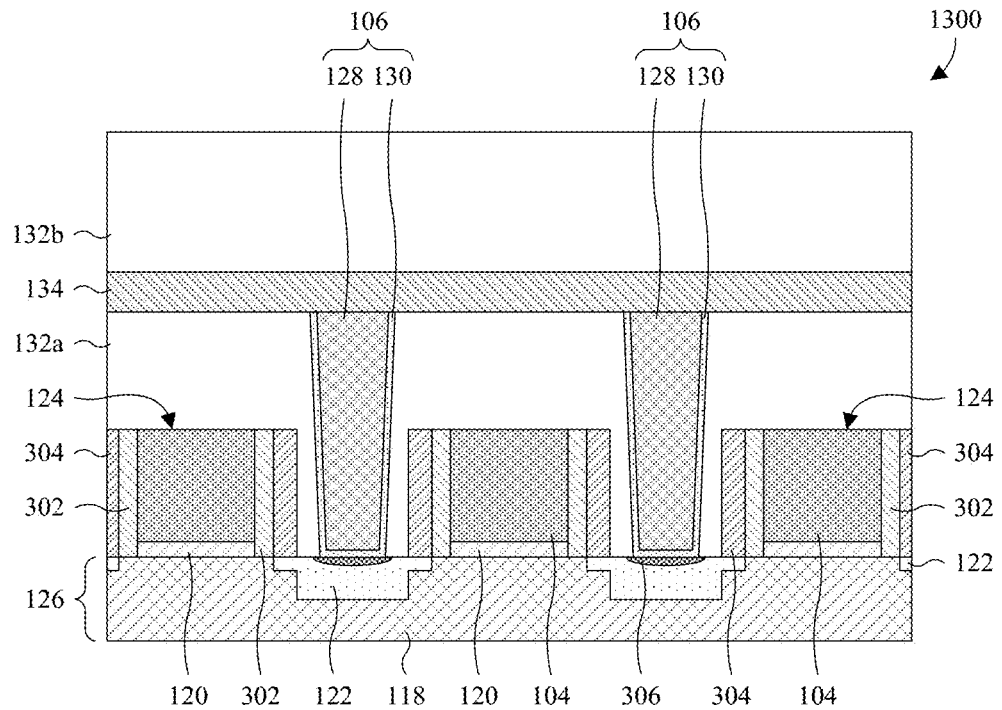

As illustrated by the cross-sectional view 1300 of FIG. 13, an etch stop layer 134 and a second ILD layer 132b are deposited over the first ILD layer 132a and the AR contacts 106. The etch stop layer 134 separates the first and second ILD layers 132a, 132b from each other and, as seen hereafter, serves as an etch stop while forming a gate contact to provide control over the vertical separation between the gate contact and the gate electrodes 104.

Figure 14:
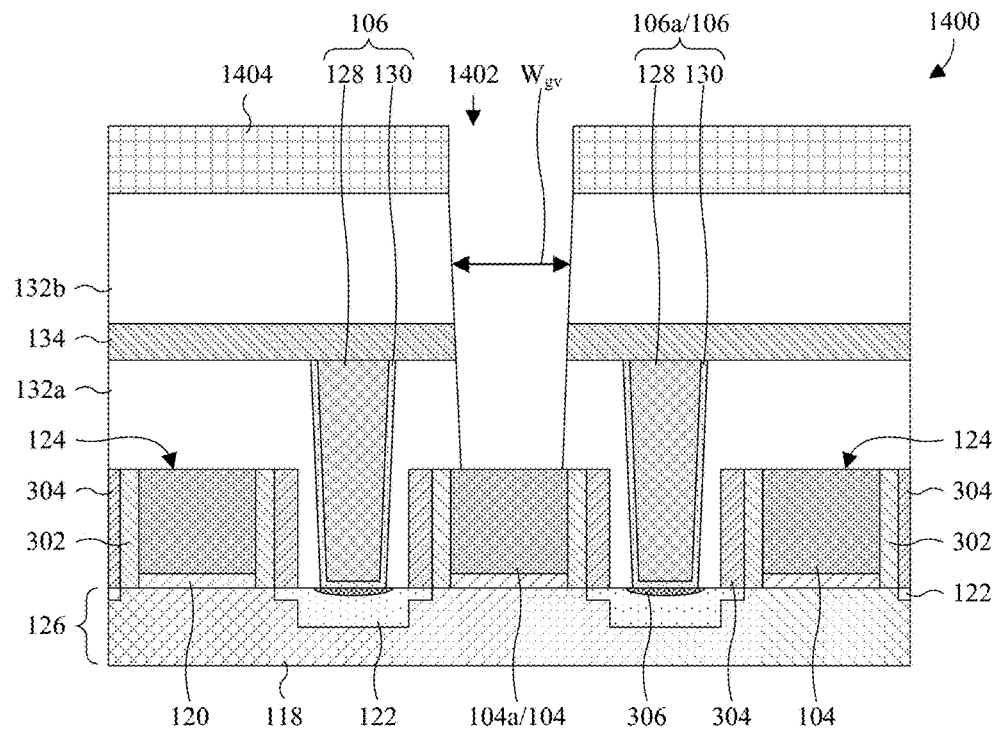

As illustrated by the cross-sectional view 1400 of FIG. 14, a second etch is performed into the first and second ILD layers 132a, 132b and the etch stop layer 134 to form a via opening 1402 exposing a first gate electrode 104a. The via opening 1402 may, for example, have a top layout as shown for the gate via(s) 114 in FIGS. 5A-5D, 6A, and 6B and/or as shown for the via pattern 504 in FIGS. 5A-5D. Other top layouts are, however, amenable.

In some embodiments, the via opening 1402 has a width $W_{gv}$ of about 8-25 nanometers, about 8.0-16.5 nanometers, about 16.5-25.0 nanometers, or some other suitable value. If the width $W_{gv}$ is too small (e.g., less than about 8 nanometers or some other suitable value), the via opening 1402 may have a high aspect ratio and hence a gate via subsequently formed in the via opening 1402 may be prone to form with seams and voids. Additionally, formation of the via opening 1402 may be challenging due to the small size. If the width $W_{gv}$ is too large (e.g., greater than about 25 nanometers or some other suitable value), there is a high risk that the via opening 1402 may get too close to a first AR contact 106a to a right side of the via opening 1402. Hence, the gate via may have high leakage current and/or electrically short with the first AR contact 106a.

A process for performing the second etch may, for example, comprise forming a second mask 1404 on the second ILD layer 132b, etching the first and second ILD layers 132a, 132b and the etch stop layer 134 with the second mask 1404 in place, and removing the second mask 1404. Other processes are, however, amenable. The second mask 1404 may, for example, be photoresist and/or some other suitable mask material(s).

Figure 15:
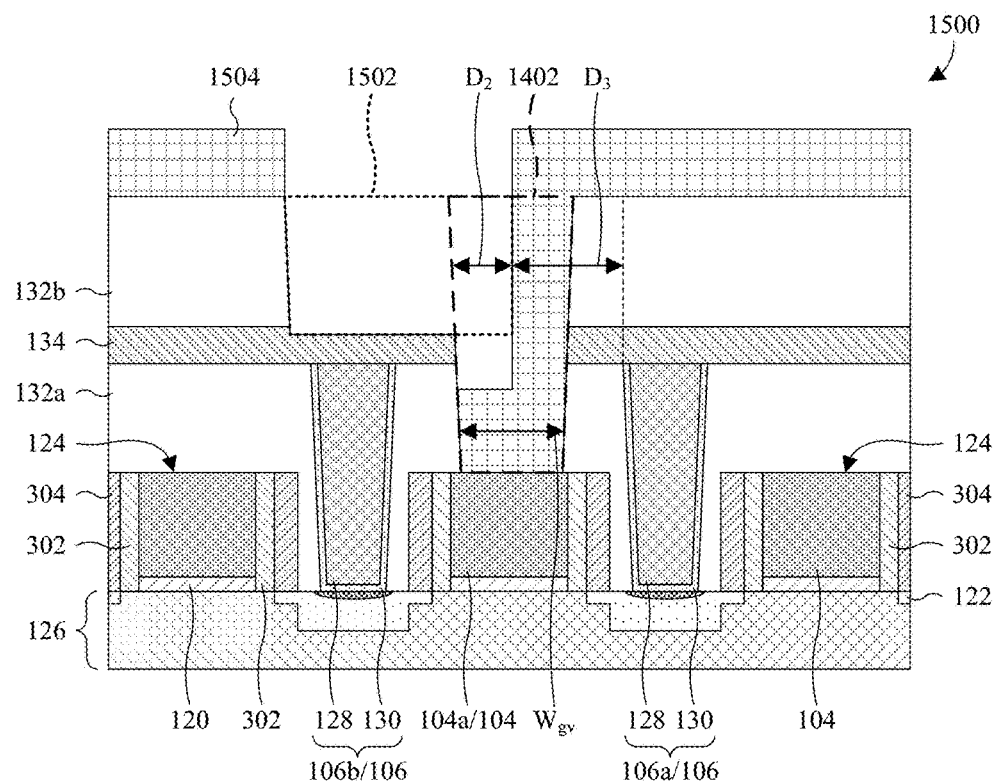

As illustrated by the cross-sectional view 1500 of FIG. 15, a third etch is performed into the second ILD layers 132b to form a contact opening 1502. The contact opening 1502 overlies a second AR contact 106b to a left side of the via opening 1402. Further, the contact opening 1502 overlaps with the via opening 1402 by a distance $D_2$ and is laterally separated by a distance $D_3$ from the first AR contact 106a. The contact opening 1502 may, for example, have a top layout as shown for the contact pattern 502 in FIGS. 5A-5D. Other top layouts are, however, amenable.

In some embodiments, the distance $D_2$ is about 5-25 nanometers, about 5-15 nanometers, about 15-25 nanometers, about 3-25 nanometers, greater than about 3 nanometers, or some other suitable value. If the distance $D_2$ is too small (e.g., less than about 3 nanometers or some other suitable value), electrical coupling between a gate contact and a gate via subsequently formed in the contact opening 1502 and the via opening 1402 may be poor and/or otherwise fail. If the distance $D_2$ is too large (e.g., greater than about 25 nanometers or some other suitable value), the contact opening 1502 may extend beyond the via opening 1402. This, in turn, increases the risk of the distance $D_3$ being too small (see below).

In some embodiments, the distance $D_3$ is about 5-25 nanometers, about 5-15 nanometers, about 15-25 nanometers, about 3-25 nanometers, greater than about 3 nanometers, or some other suitable value. If the distance $D_3$ is too small (e.g., less than about 3 nanometers or some other suitable value), leakage current may be high between a gate contact subsequently formed in the contact opening 1502 and the first AR contact 106a and/or the gate contact and the first AR contact 106a may electrically couple. If the distance $D_3$ is too large (e.g., greater than about 25 nanometers or some other suitable value), device scaling may be needlessly hindered and/or the distance D2 may be too small.

Because of the via opening 1402, the risk of the distance $D_2$ and the risk of the distance $D_3$ being too small and/or too large are reduced. The via opening 1402 provides a buffer laterally between the contact opening 1502 and the first AR contact 106a. The buffer reduces the likelihood of the contact opening 1502 getting too close to the first AR contact 106a (see, e.g., the distance $D_3$). As such, the likelihood of leakage current and/or electrical shorting is reduced. Further, the buffer allows the contact opening 1502 to get closer to the first AR contact 106a than would otherwise be possible. As such, overlay between the contact opening 1502 and the via opening 1402 (see, e.g., the distance $D_2$) is robust (e.g., has a large process window).

A process for performing the third etch may, for example, comprise forming a third mask 1504 on the second ILD layer 132b, etching the second ILD layers 132b with the third mask 1504 in place, and removing the third mask 1504. Other processes are, however, amenable. In some embodiments, the third mask 1504 is photoresist and/or some other suitable mask material(s). In some embodiments, the third mask 1504 partially fills the via opening 1402 to protect the first gate electrode 104a in the via opening 1402 and/or to protect the width $W_{gv}$ of the via opening 1402. In some embodiments, the etch stop layer 134 serves as an etch stop for the etching, such that the etching stops on the etch stop layer 134. In some embodiments, over etching occurs during the etching and the contact opening 1502 extends into the etch stop layer 134.

In some embodiments, the etching is performed by a dry etch to achieve high selectivity between the second ILD layer 132b and the etch stop layer 134 and to minimize over etching. In some embodiments, the dry etch forms plasma from an etch gas being or comprising hexafluoro-1,3-butadiene gas (e.g., $C_4F_6$) to achieve high selectivity. Other etch gases are, however, amenable. In some embodiments in which the etch gas is or comprises hexafluoro-1,3-butadiene gas, the second ILD layer 132b is or comprises silicon oxide and the etch stop layer 134 is or comprises silicon nitride. Other materials for the second ILD layer 132b and the etch stop layer 134 are, however, amenable and/or other etch gas(es) are, however, amenable. In alternative embodiments, the etching is performed by a wet etch and/or some other suitable etch process. However, the wet etch may be unable to achieve high selectivity between the second ILD layer 132b and the etch stop layer 134.

Figure 16:
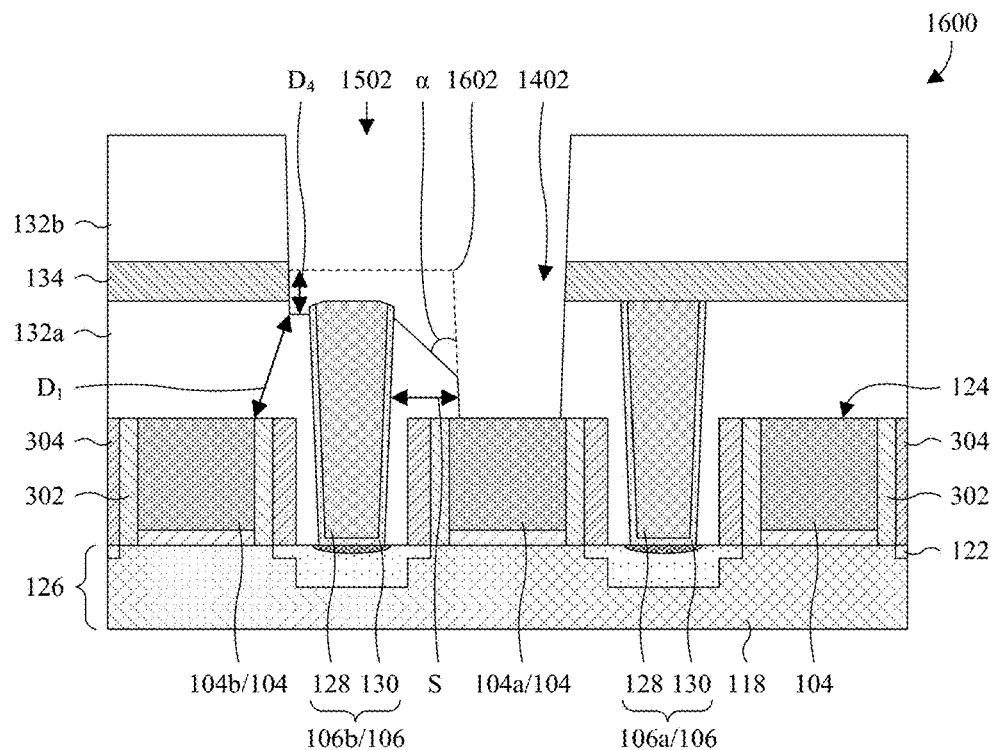

As illustrated by the cross-sectional view of 1600 of FIG. 16, a fourth etch is performed into the etch stop layer 134 to extend the contact opening 1502 to the second AR contact 106b and to recess a bottom surface of the contact opening 1502 by a distance $D_4$. Additionally, the fourth etch erodes a corner 1602 (shown in phantom) at a boundary between the via and contact openings 1402, 1502 so the bottom surface slants downward from the second AR contact 106b to the via opening 1402. The bottom surface is at an angle $\alpha$ relative to a sidewall of the via opening 1402, and the bottom surface and the sidewall are defined by the first ILD layer 132a.

By forming the contact opening 1502 so the bottom surface slants downward, the via opening 1402 and hence a gate via subsequently formed in the via opening 1402 have low aspect ratios (e.g., low ratios of height to width). The low aspect ratio of the via opening 1402 prevents clustering of material around the corner 1602 while depositing material from which the gate via is formed. The clustering may, in turn, pinch off a top of the via opening 1402 before the via opening 1402 is fully filled to form seams or voids. Such seams and voids could increase a resistance of the gate via and/or could shift operating parameters out of specification. Therefore, by forming the contact opening 1502 so the bottom surface slants downward, the likelihood of seams and voids at the via opening 1402 and hence at the gate via is reduced.

In some embodiments, the angle $\alpha$ is about 30-70 degrees, about 30-50 degrees, about 50-70 degrees, or some other suitable value. If the angle $\alpha$ is too small (e.g., less than about 30 degrees or some other suitable value), the aspect ratio of the via opening 1402 may be high. As such, the likelihood of seems and voids at a gate via subsequently formed in the via opening 1402 may be high. If the angle $\alpha$ is too large (e.g., greater than about 70 degrees or some other suitable value), over etching of the first ILD layer 132a may occur and a distance $D_1$ from the contact opening 1502 to a second gate electrode 104b may become too small. If the distance $D_1$ is too small, leakage current and/or electrically shorting may occur from the second gate electrode 104b to a gate contact subsequently formed in the contact opening 1502.

In some embodiments, the angle $\alpha$ and the aspect ratio of the gate opening 1402 depend upon a space S between the via opening 1402 and the second AR contact 106b. For example, the angle $\alpha$ and the aspect ratio may increase as the space S decreases. In some embodiments, the space S is about 9-18 nanometers, about 9.0-13.5 nanometers, about 13.5-18.0 nanometers, or some other suitable value. If the space S is too small (e.g., less than about 9 nanometers or some other suitable value), the angle $\alpha$ may be large and the aspect ratio may be high. As such, the likelihood of seems and voids at the gate via 114 may be high. At emerging and future process nodes, the space S may, for example, be limited by feature density, such that the space S may, for example, be less than about 18 nanometers or some other suitable value. In some embodiments, the space S is about 9-18 nanometers and the angle $\alpha$ is about 45-60 degrees. Other values for the space S and the angle $\alpha$ are, however, amenable.

In some embodiments, the distance $D_4$ is less than about 10 nanometers or some other suitable value. If the distance $D_4$ is too large (e.g., greater than about 10 nanometers or some other suitable value), the distance $D_1$ from the contact opening 1502 to the second gate electrode 104b may become too small. In some embodiments, the distance $D_1$ is about 5-25 nanometers, about 5-15 nanometers, about 15-25 nanometers, about 10-25 nanometers, greater than about 10 nanometers, or some other suitable value. If the distance $D_1$ is too small (e.g., less than about 5 nanometers or some other suitable value), leakage current and/or electrically shorting may occur from the second gate electrode 104b to a gate contact subsequently formed in the contact opening 1502. If the distance $D_1$ is too large (e.g., greater than about 25 nanometers or some other suitable value), an aspect ratio of the via opening 1402 may be high. As discussed above, this increases the likelihood of seams or voids forming at the via opening 1402.

A process for performing the fourth etch may, for example, comprise etching the etch stop layer 134 and subsequently cleaning etch residue. Other processes are, however, amenable. For example, the cleaning may be omitted. In some embodiments, the third etch (see, e.g., FIG. 15) and the fourth etch are performed in situ within a common etch process chamber, such that the substrate 118 is in the common etch process chamber continuously from a beginning of the third etch to an end of the fourth etch. In alternative embodiments, the fourth etch is performed in a different etch process chamber than the third etch. In some embodiments, the first ILD layer 132a serves as an etch stop for the etching of the fourth etch, such that the etching stops on the first ILD layer 132a. In some embodiments, over etching occurs during the etching, such that the contact opening 1502 extends into the first ILD layer 132a.

In some embodiments, the etching is performed by a dry etch. The dry etch allows high selectivity between the etch stop layer 134 and the first ILD layer 132a so as to minimize over etching and so as to keep the distance $D_1$ large. Further, the dry etch provides physical bombardment by ions that erode the corner 1602 and slant the bottom surface of the contact opening 1502. As noted above, the slanting prevents voids and seams from forming at the via opening 1402. In some embodiments, the dry etch forms plasma from an etch gas being or comprising tetrafluoromethane gas (e.g., $CF_4$) and/or hydrogen gas (e.g., $H_2$). Other etch gases are, however, amenable. In some embodiments in which the etch gas comprises tetrafluoromethane gas and hydrogen gas, a ratio of the hydrogen gas to the tetrafluoromethane gas is greater than about 10. For example, a flow rate of the hydrogen gas into a process chamber within which the dry etch is performed may be about 10 times greater than that for the tetrafluoromethane gas. In some embodiments in which the etch gas comprises tetrafluoromethane gas and hydrogen gas, the etch stop layer 134 is or comprises silicon nitride and the first ILD layer 132a is or comprises silicon oxide. Other materials and gases are, however, amenable. In alternative embodiments, the etching is performed by a wet etch and/or some other suitable etch process. However, the wet etch may be unable to achieve high selectivity between the etch stop layer 134 and the first ILD layer 132a and hence over etching may be high. This increases the likelihood of the distance $D_1$ getting too small (as discussed above).

In some embodiments, the cleaning is performed by or comprises plasma treatment of exposed surfaces in the via and contact openings 1402, 1502 using hydrogen gas (e.g., $H_2$) and/or nitrogen gas (e.g., $N_2$). Other gases and/or other cleaning processes are, however, amenable. The plasma treatment bombards the corner 1602 with ions and erodes the corner 1602 to further slant the bottom of the contact opening 1502. As noted above, the slanting prevents voids and seams from forming at the via opening 1402. In some embodiments, the cleaning erodes the corner 1602 by a greater extent than the etching and/or the cleaning and the etching are respectively performed by a dry etch and a plasma treatment process.

Figure 17A:
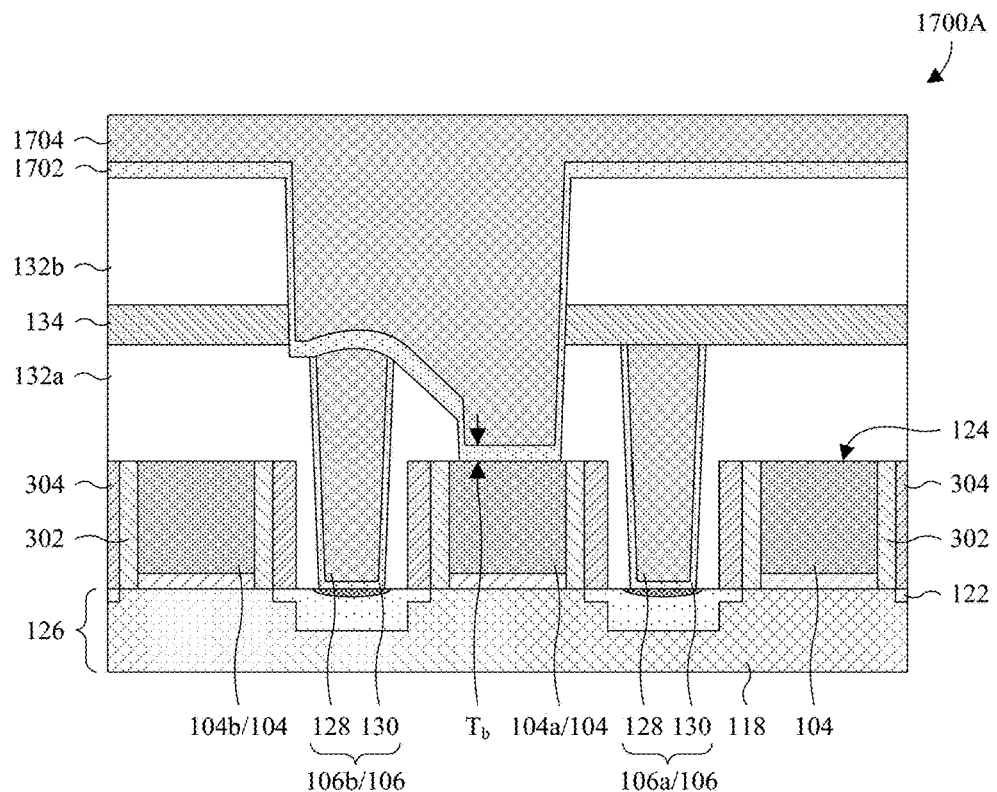

As illustrated by the cross-sectional view 1700A of FIG. 17A, a barrier layer 1702 is deposited covering the second ILD layer 132b and is further deposited lining and partially filling the contact opening 1502 (see, e.g., FIG. 16) and the via opening 1402 (see, e.g., FIG. 16). Further, a plug layer 1704 is deposited covering the barrier layer 1702 and filling a remainder of the contact opening 1502 and the via opening 1402. The barrier layer 1702 blocks material from diffusing through the barrier layer 1702 from the plug layer 1704 and/or through the barrier layer 1702 to the plug layer 1704. Further, in some embodiments, the barrier layer 1702 serves as an adhesion layer for the plug layer 1704. The barrier layer 1702 may be or comprise, for example, titanium, titanium nitride, tantalum nitride, some other suitable barrier material, or any combination of the foregoing. The plug layer 1704 may be or comprise, for example, cobalt, ruthenium, tungsten, some other suitable metal, or any combination of the foregoing.

In some embodiments, a thickness $T_b$ of the barrier layer 1702 is greater at a bottom of the barrier layer 1702 than at sidewalls of the barrier layer 1702. For example, the thickness $T_b$ may be about 3-8 nanometers at the bottom and/or about 1-3 nanometers at the sidewalls. Other thickness values are, however, amenable. If the thickness $T_b$ is too small (e.g., less than about 1 nanometer or some other suitable value), the barrier layer 1702 may be unable to effectively block material diffusion and/or the plug layer 1704 may be unable to adhere to the barrier layer 1702. If the thickness $T_b$ is too large (e.g., larger than about 8 nanometers or some other suitable value), a resistance from the plug layer 1704 to the first gate electrode 104a may be high because the barrier layer 1702 may have a high resistance relative to the plug layer 1704. The high resistance may, for example, shift operating of the IC out of specification.

The deposition of the barrier layer 1702 may, for example, be or comprise chemical vapor deposition (CVD), physical vapor deposition (PVD), some other suitable deposition process, or any combination of the foregoing. The deposition of the plug layer 1704 may, for example, be or comprise CVD, PVD, electroless plating, electroplating, some other suitable deposition process, or any combination of the foregoing.

Figure 17B:
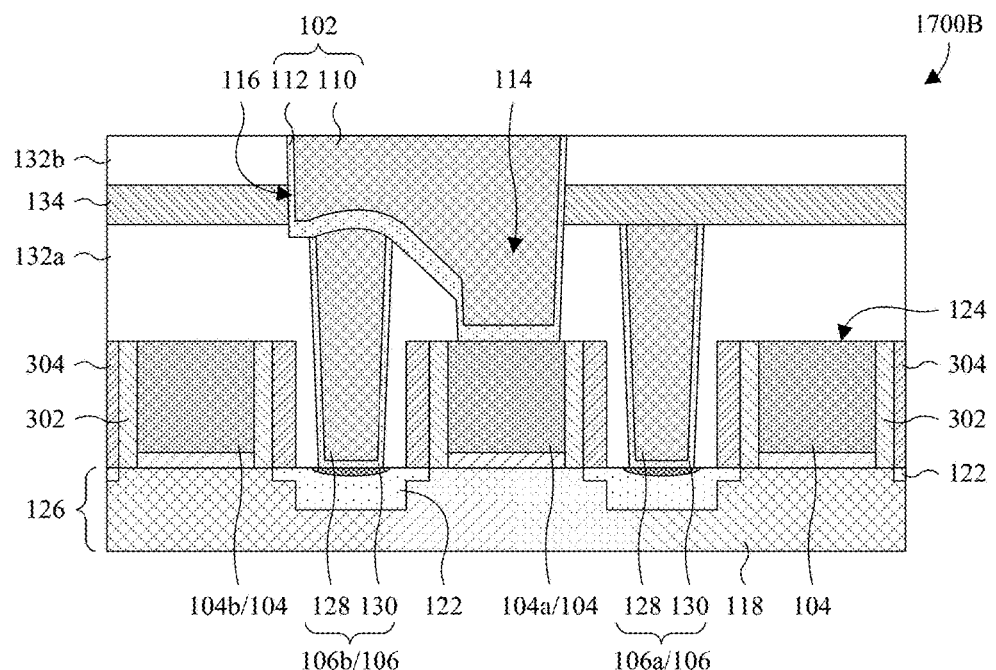

As illustrated by the cross-sectional view 1700B of FIG. 17B, a planarization is performed into the barrier layer 1702 (see, e.g., FIG. 17A), the plug layer 1704 (see, e.g., FIG. 17A), and the second ILD layer 132b until top surfaces thereof are about even. The planarization may, for example, be or comprise a CMP and/or some other suitable planarization process. The planarization forms a GC structure 102 in the contact opening 1502 (see, e.g., FIG. 16) and the via opening 1402 (see, e.g., FIG. 16).

The GC structure 102 electrically couples the first gate electrode 104a to the second AR contact 106b. The GC structure 102 comprises a GC plug 110 and a GC barrier 112 respectively formed from the plug layer 1704 and the barrier layer 1702. The GC barrier 112 cups an underside of the GC plug 110 and separates the GC plug 110 from the first gate electrode 104a and the second AR contact 106b. Further, the GC structure 102 defines a gate via 114 and a gate contact 116. A bottom surface of the GC structure 102 slants downward from the second AR contact 106b to the gate via 114. As discussed above, the slanting decreases an aspect ratio of the gate via 114 and hence reduces the likelihood of seams and/or voids. The seams and/or voids would increase a resistance from the gate contact 116 to the first gate electrode 104a and could therefore shift operating parameters of the IC out of specification.

As seen in the preceding figures (see, e.g., FIGS. 14-16, 17A, and 17B), the GC structure 102 is formed after the AR contacts 106. Because the GC structure 102 is formed after the AR contacts 106, the AR openings 1102 (see, e.g., FIG. 11) within which the AR contacts 106 are formed are filled during formation of the GC structure 102. Further, the source/drain regions 122 and/or other portions of the active region 126 in the AR openings 1102 are not exposed through the AR openings 1102 during formation of the GC structure 102. This, in turn, prevents oxidation of the source/drain regions and/or the active region 126 during formation of the GC structure 102. Such oxidation would increase resistance from the AR contacts 106 to the active region 126. Such increased resistance could, in turn, shift operating parameters of the IC out of specification, reduce yields, increase power consumption, and so on.

Also, as seen in the preceding figures (see, e.g., FIGS. 14-16, 17A, and 17B), the gate contact 116 is formed spaced over and electrically coupled to the first gate electrode 104a by the gate via 114. Forming the gate contact 116 as such has a larger process window (e.g., is more robust) than omitting the gate via 114 and forming the gate contact 116 directly on the first gate electrode 104a. Forming the gate contact 116 directly on the gate electrode 104 comprises landing the contact opening 1502 (see, e.g., FIG. 16) on both the first gate electrode 104a and the second AR contact 106b while remaining sufficiently spaced from the second gate electrode 104b and the first AR contact 106a to avoid leakage current and/or electrical coupling. As such, landing the contact opening 1502 directly on the gate electrode 104 is subject to a large number of overlay and/or dimension constraints. Further, because of the large size of the contact opening 1502, the constraints are fairly stringent to avoid leakage current and/or electrical coupling.

In contrast, forming the gate contact 116 spaced over and electrically coupled to the gate electrode 104 by the gate via 114 comprises landing the via opening 1402 (see, e.g., FIG. 16) on the gate electrode 104 and landing the contact opening 1502 on the via opening 1402. These two landings individually and collectively have larger process windows (e.g., are more robust) than landing the contact opening 1502 on the first gate electrode 104a. Landing the via opening 1402 on the first gate electrode 104a is subject to fewer constraints than landing the contact opening 1502 on the first gate electrode 104a. The via opening 1402 does not land on the second AR contact 106b, so the via opening 1402 may be centered over the first gate electrode 104a. Further, the via opening 1402 is smaller than the contact opening 1502, so there is less risk of the via opening 1402 getting too close to the first AR contact 106a and causing leakage current and/or electrical shorting. As such, overlay and/or dimension constraints may be less stringent.

Landing the contact opening 1502 on the via opening 1402 is subject to less stringent constraints than landing the contact opening 1502 on the first gate electrode 104a. The contact opening 1502 is vertically offset from the second gate electrode 104b, such that there is less of a risk of the contact opening 1502 getting too close to the second gate electrode 104b and causing leakage current and/or electrical shorting. Further, the via opening 1402 provides a buffer laterally between the contact opening 1502 and the first AR contact 106a. The buffer reduces the likelihood of the contact opening 1502 getting too close to first AR contact 106a and causing leakage current and/or electrical shorting with the first AR contact 106a.

After forming the GC structure 102 at FIG. 17B, a BEOL region (not shown) may be formed over the GC structure 102 and the second ILD layer 132b. For examples of such a BEOL region, see the BEOL region 402 in FIGS. 4A and 4B.

While FIGS. 17A and 17B illustrate formation of the GC structure 102 with the GC barrier 112, the GC barrier 112 may be omitted in alternative embodiments. In some embodiments in which the GC barrier 112 is omitted, the barrier layer 1702 is omitted at FIG. 17A. The acts at FIG. 17B then proceed as described above without the barrier layer 1702. In alternative embodiments in which the GC barrier 112 is omitted, the acts at FIGS. 18A-18C (described hereafter) are performed in place of the acts at FIGS. 17A and 17B. In other words, the method proceeds from FIGS. 9-16 to FIGS. 18A-18C while skipping FIGS. 17A and 17B.

Figure 18A:
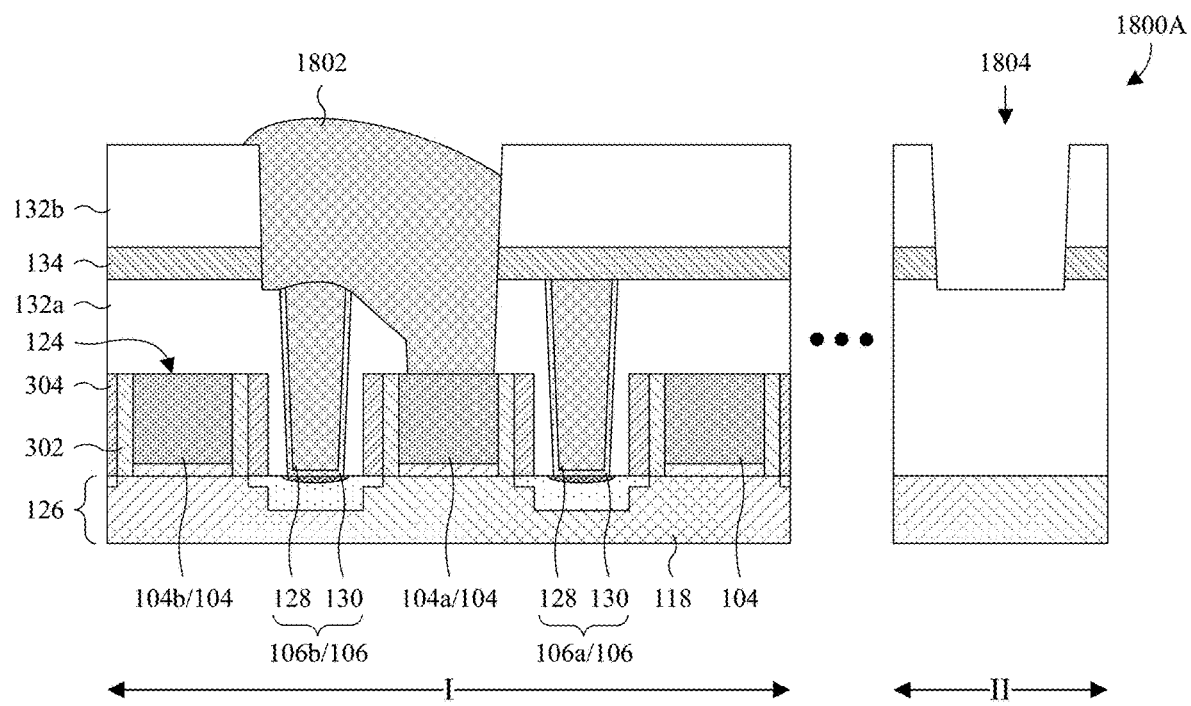
Figure 18B:
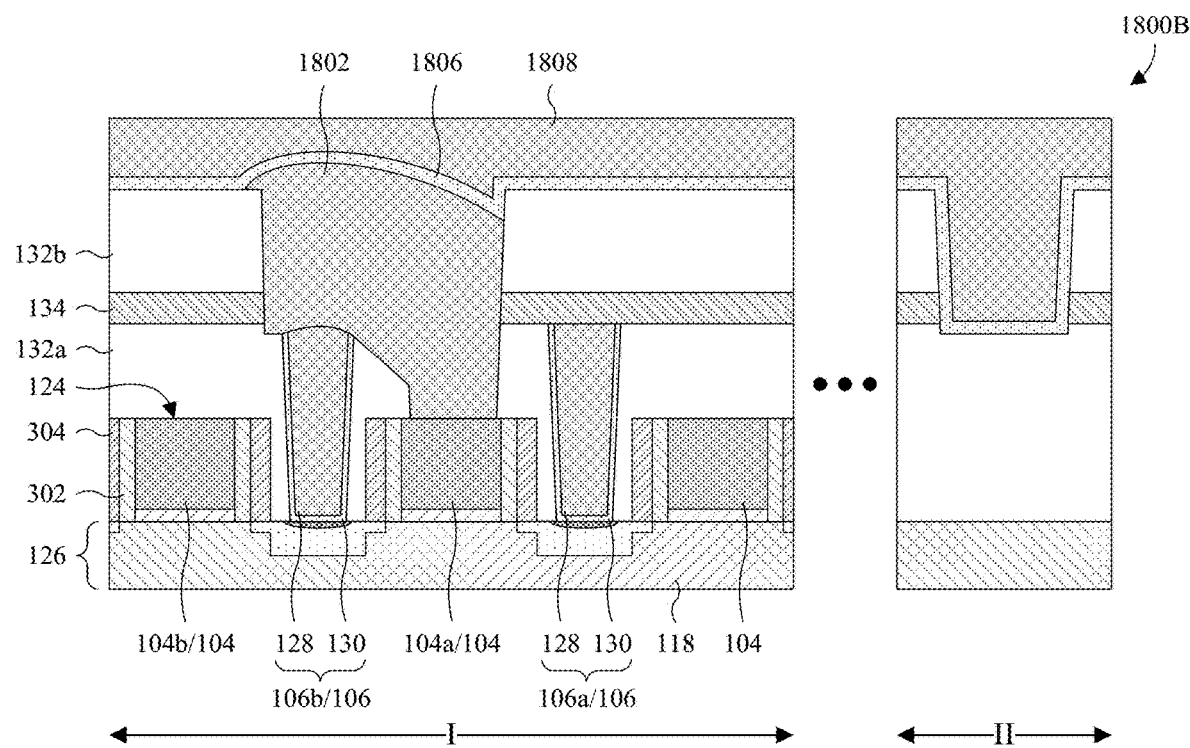
Figure 18C:
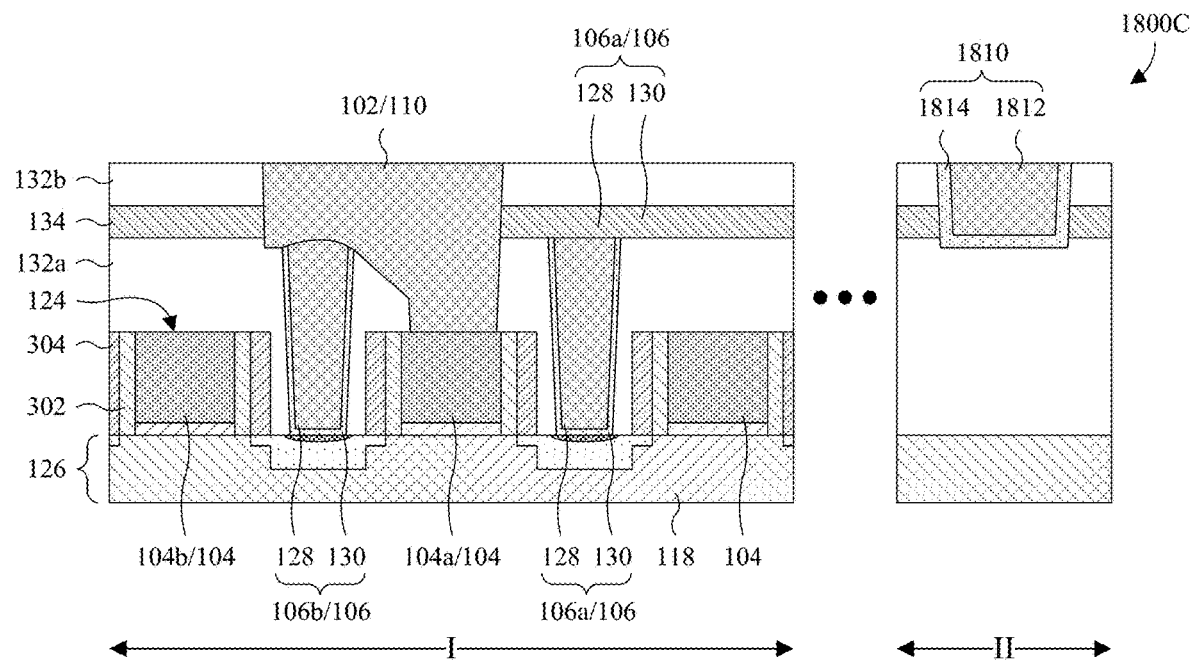

With reference to FIGS. 18A-18C, a series of cross-sectional views 1800A-1800C of some alternative embodiments of the series of cross-sectional views 1700A and 1700B of FIGS. 17A and 17B is provided. The cross-sectional views 18A-18C correspond to the cross-sectional view 300B of FIG. 3B and therefore illustrate formation of the IC and the GC structure 102 in FIG. 3B. However, the method illustrated by the cross-sectional views 1800A-1800C may also be employed to form the IC and/or the GC structure 102 in any of FIGS. 1B, 2A, 2B, 6A, and 6B.

As illustrated by the cross-sectional view 1800A of FIG. 18A, a first IC region I and a second IC region II are formed. The first IC region I, less a first plug layer 1802, is formed according to the acts described and illustrated at FIGS. 9-16. Similarly, the second IC region II is formed according to the acts described at FIGS. 9-16. However, the second IC region II is not illustrated in FIGS. 9-16. The second IC region II comprises a peripheral opening 1804 in the second ILD layer 132b and the etch stop layer 134. Further, in some embodiments, the peripheral opening 1804 extends into the first ILD layer 132a due to over etching. The peripheral opening 1804 may, for example, be formed with the contact opening 1502 at FIGS. 15 and 16.

Also illustrated by the cross-sectional view 1800A of FIG. 18A, the first plug layer 1802 is grown from seed material in the contact opening 1502 (see, e.g., FIG. 16) and the via opening 1402 (see, e.g., FIG. 16). The first plug layer 1802 grows filling the contact opening 1502 and the via opening 1402 because the second AR contact 106b and/or the first gate electrode 104a serve as seed material. However, the first plug layer 1802 does not grow filling the peripheral opening 1804 because the peripheral opening 1804 is devoid of seed material.

In some embodiments, the seed material from which the first plug layer 1802 grows is metal and/or the peripheral opening 1804 is devoid of metal. In some embodiments, the first gate electrode 104a and the second AR contact 106b have different seed materials and/or the different seed materials lead to different growth rates respectively at the first gate electrode 104a and the second AR contact 106b. In some embodiments, the first plug layer 1802 has different thicknesses respectively overlying the first gate electrode 104a and the second AR contact 106b due to the different growth rates. The second AR contact 106b and/or the first gate electrode 104a may be or comprise, for example, tungsten and/or cobalt, whereas the first plug layer 1802 may be or comprise, for example, tungsten. Other materials are, however, amenable. Further, the first plug layer 1802 may be or comprise, for example, cobalt, ruthenium, tungsten, some other suitable metal, or any combination of the foregoing.

The first plug layer 1802 may, for example, be grown by CVD, electroless plating, electroplating, or some other suitable growth process. In some embodiments, the first plug layer 1802 is or comprises tungsten and/or is grown by CVD using tungsten fluoride (e.g., WF6) and hydrogen (e.g., $H_2$) precursors. Other materials, growth processes, and precursors are, however, amenable for the first plug layer 1802.

As illustrated by the cross-sectional view 1800B of FIG. 18B, a barrier layer 1806 is deposited covering the first plug layer 1802 and the second ILD layer 132b. Further, the barrier layer 1806 is deposited partially filling and lining the peripheral opening 1804 (see, e.g., FIG. 18A). The barrier layer 1806 may be or comprise, for example, titanium, titanium nitride, tantalum nitride, some other suitable barrier material, or any combination of the foregoing. The deposition of the barrier layer 1806 may, for example, be or comprise CVD, PVD, some other suitable deposition process, or any combination of the foregoing.

Also illustrated by the cross-sectional view 1800B of FIG. 18B, a second plug layer 1808 is deposited covering the barrier layer 1806 and filling a remainder of the peripheral opening 1804. The barrier layer 1806 blocks material from diffusing through the barrier layer 1806 from the second plug layer 1808 and/or through the barrier layer 1806 to the second plug layer 1808. Further, in some embodiments, the barrier layer 1806 serves as an adhesion layer for the second plug layer 1808. The second plug layer 1808 may be or comprise, for example, cobalt, ruthenium, tungsten, some other suitable metal, or any combination of the foregoing. The deposition of the second plug layer 1808 may, for example, be or comprise CVD, PVD, electroless plating, electroplating, some other suitable deposition process, or any combination of the foregoing.

As illustrated by the cross-sectional view 1800C of FIG. 18C, a planarization is performed into the first and second plug layers 1802, 1808, the barrier layer 1806, and the second ILD layer 132b until top surfaces thereof are about even. The planarization may, for example, be or comprise a CMP and/or some other suitable planarization process. The planarization forms a GC structure 102 in the contact opening 1502 (see, e.g., FIG. 16) and the via opening 1402 (see, e.g., FIG. 16) and further forms a peripheral structure 1810 in the peripheral opening 1804 (see, e.g., FIG. 18A). The peripheral structure 1810 comprises a peripheral plug 1812 and a peripheral barrier 1814 cupping an underside of the peripheral plug 1812. The peripheral structure 1810 may, for example, be a test line, a dummy structure, or some other suitable structure.

While FIGS. 9-16, 17A, 17B, and 18A-18C are described with reference to various embodiments of a method, it will be appreciated that the structures shown in FIGS. 9-16, 17A, 17B, and 18A-18C are not limited to the method but rather may stand alone separate of the method. While FIGS. 9-16, 17A, 17B, and 18A-18C are described as a series of acts, it will be appreciated that the order of the acts may be altered in other embodiments. While FIGS. 9-16, 17A, 17B, and 18A-18C illustrate and describe as a specific set of acts, some acts that are illustrated and/or described may be omitted in other embodiments. Further, acts that are not illustrated and/or described may be included in other embodiments.

For example, embodiments of the method illustrated by FIGS. 9-16, 17A, and 17B may be modified to form the GC structure 102 (see, e.g., FIG. 17B) and the second AR structure 106b (see, e.g., FIG. 17B) as their counterparts are in FIG. 1C or 1D. In some embodiments in which the method is modified for FIG. 1C, the second AR contact 106b is not formed at FIGS. 11 and 12. Instead, a fifth etch is performed between FIGS. 16 and 17A to form an AR opening. Further, the method proceeds according to the acts at FIGS. 17A and 17B to form the second AR contact 106b in the AR opening. In some embodiments in which the method is modified for FIG. 1D, the same process used for FIG. 1C is employed except that the barrier layer 1702 is omitted at FIG. 17A.

Figure 19:
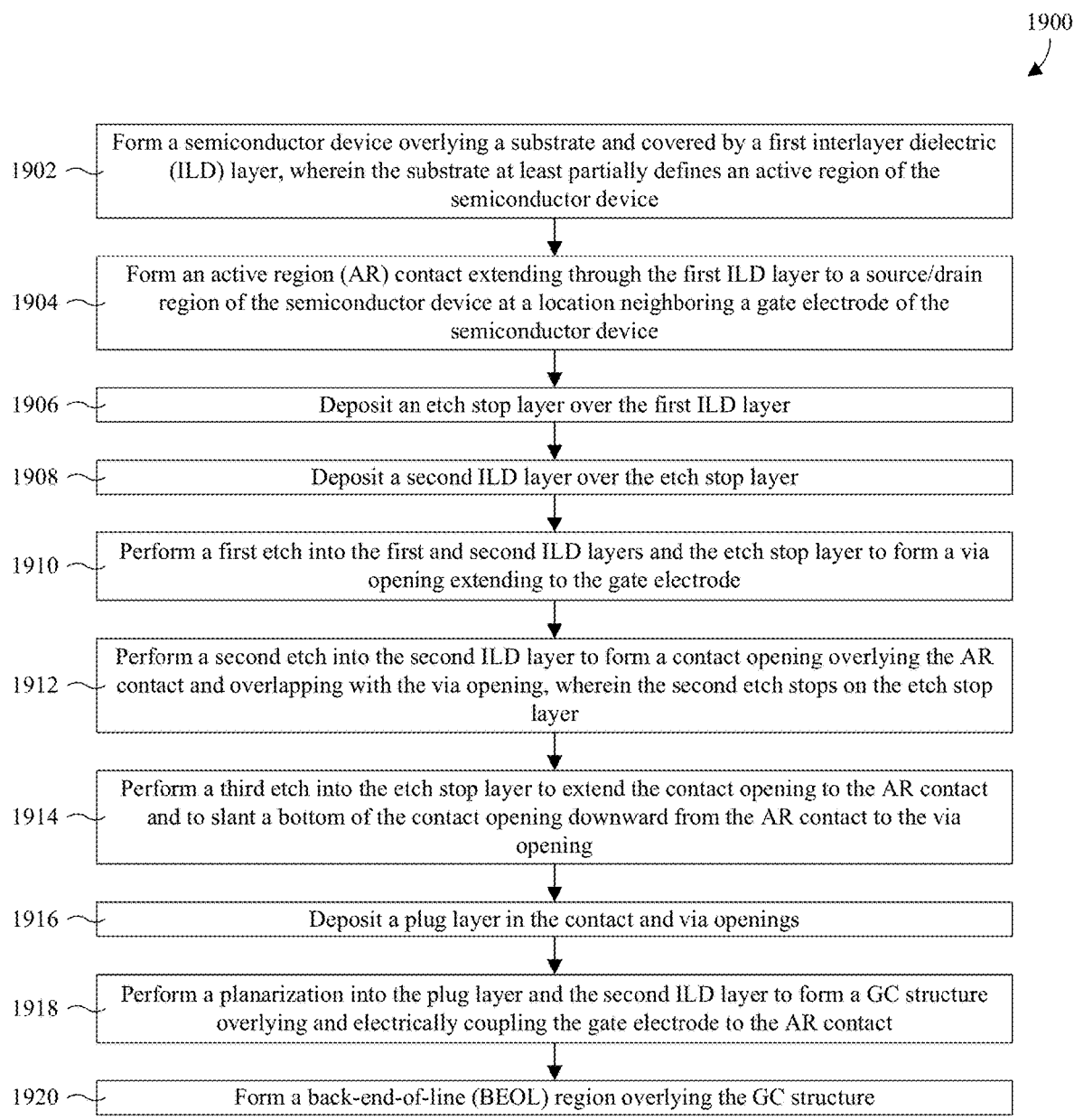
FIG. 19 illustrates a block diagram of some embodiments of the method of FIGS. 9-16, 17A, 17B, and 18A-18C.

With reference to FIG. 19, a block diagram 1900 of some embodiments of the method of FIGS. 9-16, 17A, 17B, and 18A-18C is provided.

At 1902, a semiconductor device is formed overlying a substrate and covered by a first ILD layer, wherein the substrate at least partially defines an active region of the semiconductor device. See, for example, FIGS. 9 and 10.

At 1904, an active region (AR) contact is formed extending through the first ILD layer to a source/drain region of the semiconductor device at a location neighboring a gate electrode of the semiconductor device. See, for example, FIGS. 11 and 12. In alternative embodiments, the AR contact extends to a body contact region of the semiconductor device or to some other location at the active region of the semiconductor device.

At 1906, an etch stop layer is deposited over the first ILD layer. See, for example, FIG. 13.

At 1908, a second ILD layer is deposited over the etch stop layer. See, for example, FIG. 13.

At 1910, a first etch is performed into the first and second ILD layers to form a via opening extending to the gate electrode. See, for example, FIG. 14.

At 1912, a second etch is performed into the second ILD layer to form a contact opening overlying the AR contact and overlapping with the via opening, wherein the second etch stops on the etch stop layer. See, for example, FIG. 15.

At 1914, a third etch is performed into the etch stop layer to extend the contact opening to the AR contact and to slant a bottom of the contact opening downward from the AR contact to the via opening. See, for example, FIG. 16.

At 1916, a plug layer is deposited in the contact and via openings. See, for example, FIG. 17A or FIG. 18A.

At 1918, a planarization is performed into the plug layer and the second ILD layer to form a GC structure overlying and electrically coupling the gate electrode to the AR contact. See, for example, FIG. 17B or FIG. 18C. The GC structure defines a gate contact and a gate via separating the gate contact from the gate electrode. Because the bottom of the contact opening is slanted, an aspect ratio of the via opening is low. This reduces the likelihood or otherwise prevents seams and/or voids from forming in the plug layer during deposition. Such seams and/or voids would increase a resistance from the gate contact to the gate electrode, which increases power consumption and potentially shifts operating parameters out of specification. Hence, slanting the bottom of the contact opening may improve yields and/or reduce power consumption.

At 1920, a back-end-of-line (BEOL) region is formed overlying the GC structure. Non-limiting examples of such a BEOL region may be found through reference to the BEOL region 402 in FIGS. 4A and 4B.

While the block diagram 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an IC comprising: a substrate; a source/drain region overlying and inset into a top of the substrate; a gate electrode bordering the source/drain region over the substrate; a first level contact overlying and electrically coupled to the source/drain region; a second level contact overlying the first level contact and the gate electrode; and a gate via extending from the second level contact to the gate electrode, wherein a bottom surface of the second level contact slants downward from the first level contact to the gate via. In some embodiments, the IC further comprises a metal plug and a metal barrier both defining the second level contact and the gate via, wherein the metal barrier cups an underside of the metal plug and separates the metal plug from the first level contact. In some embodiments, the IC further comprises: a first ILD layer over the substrate; a second ILD layer over the first ILD layer; and a etch stop layer between and directly contacting the first and second ILD layers respectively at a lower dielectric interface and an upper dielectric interface, wherein the first and second level contacts directly contact at an inter-contact interface that is recessed relative to the lower dielectric interface. In some embodiments, the IC further comprises a first plug defining both the second level contact and the gate via and consisting essentially of a single material, wherein the first level contact comprises a second plug and a diffusion barrier wrapping around a bottom of the second plug, and wherein the first plug overlies and directly contacts a top surface of the diffusion barrier and a top surface of the second plug. In some embodiments, the bottom surface of the second level contact slants downward from the first level contact to the gate via in a first direction, wherein the second level contact is laterally elongated in the first direction, and wherein the first level contact is laterally elongated in a second direction transverse to the first direction. In some embodiments, the bottom surface of the second level contact is at an angle of about 30-70 degrees relative to a sidewall of the gate via. In some embodiments, a top surface of the second level contact is completely spaced from vias and wires over the second level contact.

In some embodiments, the present disclosure provides another IC comprising: a substrate; a device overlying the substrate and comprising a gate electrode, wherein the substrate at least partially defines an AR of the device; an AR contact extending along a sidewall of the gate electrode from the AR to a top surface of the AR contact that is elevated above a top surface of the gate electrode; and a GC structure overlying the AR contact and the gate electrode, wherein the GC structure extends from the top surface of the gate electrode to the top surface of the AR contact, wherein the GC structure defines a gate via extending to the top surface of the gate electrode and spaced from the AR contact, and wherein the GC structure has a width increasing continuously from a top of the gate via to the top surface of the AR contact. In some embodiments, the device comprises a source/drain region bordering the gate electrode in the AR, wherein the AR contact extends from the source/drain region to the top surface of the AR contact. In some embodiments, the width of the GC structure increases from the top surface of the gate electrode to the top of the gate via at a first rate, wherein the width of the GC structure increases from the top of the gate via to the top surface of the AR contact at a second rate greater than the first rate. In some embodiments, a bottom surface of the GC structure is angled upward from a first sidewall of the gate via to a second sidewall of the AR contact. In some embodiments, the IC further comprises: an ILD layer underlying the GC structure and directly contacting a bottom surface of the GC structure; and an etch stop layer overlying and directly contacting the ILD layer, wherein the etch stop layer laterally contacts the GC structure and is spaced from the AR contact. In some embodiments, a top surface of the GC structure has a first material across a majority of the top surface, wherein a bottom surface of the GC structure directly contacts the AR contact at an interface, and wherein the bottom surface of the GC structure has the first material at the interface. In some embodiments, the GC structure comprises: a metal plug; and a metal liner layer on sidewalls of the metal plug and on a bottom surface of the metal plug, wherein the metal liner layer separates the metal plug from the AR contact and the gate electrode.

In some embodiments, the present disclosure provides a method for forming an IC, the method comprising: forming an AR contact extending through a first ILD layer to an AR of a semiconductor device; depositing an etch stop layer (ESL) and a second ILD layer covering the first ILD layer and the AR contact, wherein the ESL is between the first and second ILD layers; performing a first etch into the ESL and the first and second ILD layers to form a first opening exposing a gate electrode of the semiconductor device; performing a second etch that is into the second ILD layer, and that stops on the ESL, to form a second opening overlying the AR contact and overlapping with the first opening; performing a third etch into the ESL through the second opening to expose the AR contact, wherein the third etch slants a bottom of the second opening downward from the AR contact to the first opening; and forming a GC structure filling the first and second openings and electrically coupling the gate electrode to the AR contact. In some embodiments, the method further comprises performing a cleaning process between the performing of the third etch and the forming of the GC structure, wherein the cleaning process further slants the bottom of the second opening downward from the AR contact to the first opening. In some embodiments, the performing of the third etch comprises: forming plasma from a mixture of hydrogen gas and tetrafluoromethane gas; and applying the plasma to the ESL. In some embodiments, the hydrogen gas has a first flow rate during the third etch, wherein the tetrafluoromethane gas has a second flow rate during the third etch, and wherein the first flow rate is about 10 times greater than the second flow rate. In some embodiments, the forming of the GC structure comprises: depositing a barrier layer lining and partially filling the first and second openings; depositing a plug layer filling a remainder of the first and second openings over the barrier layer; and performing a planarization into the barrier layer and the plug layer until top surfaces respectively of the barrier layer and the plug layer are about even with a top surface of the second ILD layer. In some embodiments, the forming of the GC structure comprises: selectively growing a plug layer filling the first and second openings from seed material of the gate electrode and seed material of the AR contact, wherein the plug layer directly contacts sidewalls of the second ILD layer in the first and second openings; and performing a planarization into the plug layer to level a top surface of the plug layer with a top surface of the second ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
a substrate;
a source/drain region overlying and inset into a Lop of the substrate;
a gate electrode bordering the source/drain region and located over the substrate;
a first level contact overlying and electrically coupled to the source/drain region;
a second level contact overlying the first level contact and the gate electrode; and
a gate via extending from the second level contact to the gate electrode, wherein a bottom surface of the second level contact slants downward from the first level contact to the gate via.

2. The IC according to claim 1, further comprising a metal plug and a metal barrier both defining the second level contact and the gate via, and wherein the metal barrier cups an underside of the metal plug and separates the metal plug from the first level contact.

3. The IC according to claim 1, further comprising:
a first interlayer dielectric (ILD) layer over the substrate;
a second ILD layer over the first ILD layer; and
a etch stop layer between and directly contacting the first and second ILD layers respectively at a lower dielectric interface and an upper dielectric interface, wherein the first and second level contacts directly contact at an inter-contact interface that is recessed relative to the lower dielectric interface.

4. The IC according to claim 1, further comprising a first plug defining both the second level contact and the gate via and consisting essentially of a single material, wherein the first level contact comprises a second plug and a diffusion barrier wrapping around a bottom of the second plug, and wherein the first plug overlies and directly contacts a top surface of the diffusion barrier and a top surface of the second plug.

5. The IC according to claim 1, wherein the bottom surface of the second level contact slants downward from the first level contact to the gate via in a first direction, wherein the second level contact is laterally elongated in the first direction, and wherein the first level contact is laterally elongated in a second direction transverse to the first direction.

6. The IC according to claim 1, wherein the bottom surface of the second level contact is at an angle of about 30-70 degrees relative to a sidewall of the gate via.

7. The IC according to claim 1, wherein a top surface of the second level contact is completely spaced from vias and wires over the second level contact.

8. An integrated circuit (IC) comprising:
a substrate;

a device overlying the substrate and comprising a gate electrode, wherein the substrate at least partially defines an active region (AR) of the device;

an AR contact extending along a sidewall of the gate electrode from the AR to a top surface of the AR contact that is elevated above a top surface of the gate electrode; and a gate-to-contact (GC) structure overlying the AR contact and the gate electrode, wherein the GC structure extends from the top surface of the gate electrode to the top surface of the AR contact, wherein the GC structure defines a gate via extending to the top surface of the gate electrode and spaced from the AR contact, and wherein the GC structure has a width increasing continuously from a top of the gate via to the top surface of the AR contact.

9. The IC according to claim 8, wherein the device comprises a source/drain region bordering the gate electrode in the AR, and wherein the AR contact extends from the source/drain region to the top surface of the AR contact.

10. The IC according to claim 8, wherein the width of the GC structure increases from the top surface of the gate electrode to the top of the gate via at a first rate, and wherein the width of the GC structure increases from the top of the gate via to the top surface of the AR contact at a second rate greater than the first rate.

11. The IC according to claim 8, wherein a bottom surface of the GC structure is angled upward from a first sidewall of the gate via to a second sidewall of the AR contact.

12. The IC according to claim 8, further comprising:

an interlayer dielectric (ILD) layer underlying the GC structure and directly contacting a bottom surface of the GC structure; and an etch stop layer overlying and directly contacting the ILD layer, wherein the etch stop layer laterally contacts the GC structure and is spaced from the AR contact.

13. The IC according to claim 8, wherein a top surface of the GC structure has a first material across a majority of the top surface, wherein a bottom surface of the GC structure directly contacts the AR contact at an interface, and wherein the bottom surface of the GC structure has the first material at the interface.

14. The IC according to claim 8, wherein the GC structure comprises:

a metal plug; and a metal liner layer on sidewalls of the metal plug and on a bottom surface of the metal plug, wherein the metal liner layer separates the metal plug from the AR contact and the gate electrode.

15. An integrated circuit (IC) comprising:

a substrate;

a first source/drain region and a second source/drain region overlying and inset into the substrate;

a gate electrode between and bordering the first and second source/drains region over the substrate;

a gate contact overlying and spaced from the gate electrode and the first source/drain region;

a gate via extending from the gate contact to the gate electrode; and a first active region (AR) contact and a second AR contact overlying and extending respectively from the first and second source/drain regions, wherein the first AR contact extends from the first source/drain region to the gate contact, and wherein the second AR contact is spaced from the gate contact;

wherein the gate contact has a bottom edge on an opposite side of the first AR contact as the gate electrode, and wherein the bottom edge is recessed relative to a top surface of the second AR contact.

16. The IC according to claim 15, further comprising:

an etch stop layer overlying the gate electrode and the second AR contact and within which the gate contact is inset, wherein the etch stop layer has a bottom surface that directly contacts the top surface of the second AR contact and that extends laterally at an elevation greater than that of the bottom edge.

17. The IC according claim 16, wherein the bottom surface of the etch stop layer and the top surface of the second AR contact directly contact at a planar interface, and wherein a bottom surface of the gate contact and a top surface of the first AR contact directly contact at a curved interface.

18. The IC according to claim 15, wherein the gate via has a sidewall overlying the gate electrode and facing the first AR contact, and wherein a bottom surface of the gate contact slants upward from a top of the sidewall to the first AR contact.

19. The IC according to claim 15, wherein a bottom surface of the gate contact and a top surface of the gate electrode have a vertical separation between the first AR contact and the gate via, and wherein the vertical separation increases laterally from the gate via to the first AR contact.

20. The IC according to claim 15, wherein the first AR contact and the gate electrode are laterally spaced in a first direction, and wherein a dimension of the first AR contact laterally in a second direction transverse to the first direction is greater than that of the gate contact.

* * * * *